US012805232B2

(12) United States Patent
Jin

(10) Patent No.: US 12,805,232 B2
(45) Date of Patent: Nov. 17, 2026

(54) METHOD OF FORMING SEMICONDUCTOR STRUCTURE

(71) Applicant: Semiconductor Manufacturing International (Shanghai) Corporation, Shanghai (CN)

(72) Inventor: Jisong Jin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 177 days.

(21) Appl. No.: 18/966,632

(22) Filed: Dec. 3, 2024

(65) Prior Publication Data

US 2025/0391669 A1 Dec. 25, 2025

(30) Foreign Application Priority Data

Jun. 19, 2024 (CN) ......................... 202410798563.3

(51) Int. Cl.
*H10P 50/00* (2026.01)
*H10P 30/40* (2026.01)

(52) U.S. Cl.
CPC .............. *H10P 50/73* (2026.01); *H10P 30/40* (2026.01)

(58) Field of Classification Search
CPC ...... H10P 50/69; H10P 50/695; H10P 50/696; H10P 50/71; H10P 50/73; H10P 30/40
See application file for complete search history.

(56) References Cited

U.S. PATENT DOCUMENTS 10,685,838 B1 * 6/2020 Shiliang ............... H10D 62/292
10,991,596 B2 4/2021 Jisong
11,869,770 B2 * 1/2024 Shankar .................. C23C 16/04
2014/0220782 A1 * 8/2014 Seo ......................... H10P 50/71 438/703
2019/0164758 A1 * 5/2019 Su ......................... H10D 30/024
2019/0385902 A1 * 12/2019 Wang ................... H10D 30/024
2020/0211848 A1 * 7/2020 Shiliang ............... H10D 62/292
2021/0098258 A1 * 4/2021 Degai .................... H10P 14/412
2021/0175080 A1 * 6/2021 Jisong .................. H10D 30/024
2026/0114198 A1 * 4/2026 Jin ......................... H10P 50/692
2026/0114245 A1 * 4/2026 Jin ......................... H10B 12/09
2026/0114246 A1 * 4/2026 Jin ......................... H10B 10/12
2026/0114247 A1 * 4/2026 Jin ......................... H10B 10/12

FOREIGN PATENT DOCUMENTS

CN 111640668 B 7/2023

* cited by examiner

*Primary Examiner* — Chi Q Nguyen

(74) *Attorney, Agent, or Firm* — Anova Law Group, PLLC

(57) ABSTRACT

Method of forming semiconductor structure is provided. The method includes providing a substrate including base, target material layer, second core material layer and first core material layer, where the substrate includes first region and second region; forming a first core layer; forming a first spacer; forming a first protection layer; forming a third core material layer; forming a second protection layer over the second core material layer and the third core material layer in the second region; forming a second core layer corresponding to the second core material layer and a third core layer corresponding to the third core material layer; forming a fourth core layer; forming a second spacer covering sidewalls of the second core layer, the third core layer, and the fourth core layer; and forming a first target structure located in the first region and a second target structure located in the second region.

20 Claims, 19 Drawing Sheets

(a)

(b)

METHOD OF FORMING SEMICONDUCTOR STRUCTURE

CROSS-REFERENCE TO RELATED APPLICATION

This application claims priority of Chinese Patent Application No. 202410798563.3, filed on Jun. 19, 2024, the entire content of which is hereby incorporated by reference.

FIELD OF THE DISCLOSURE

The present disclosure generally relates to the field of semiconductor manufacturing and, more particularly, relates to a method of forming a semiconductor structure.

BACKGROUND

With rapid development of semiconductor manufacturing technology, semiconductor devices are moving towards higher component densities and higher integration levels. Photolithography is a commonly used patterning method and critical production technology in semiconductor manufacturing. As critical dimensions (CDs) and pitches of semiconductor devices continuously decrease, self-aligned double patterning (SADP) may no longer meet present process requirements, and the self-aligned quadruple patterning (SAQP) method came into being. The minimum pitch that SADP may achieve under general DUV technology is about half of the pitch limit of approximately 76 nm of single DUV exposure, which is approximately 38 nm. By analogy, the pitch limit of SAQP under general DUV technology is approximately 19 nm. In general, for achieving a good yield, the pitch limit of SADP is approximately 40 nm, while the pitch limit of SAQP is approximately 24 nm. In the back-end process, a self-aligned litho-etch-litho-etch (SALELE) process is often used instead of SADP or SAQP, to form metal patterns. SALELE may have the advantage of greater design freedom than SADP. However, the metal pitch limit of SALELE is close to the metal pitch limit of SADP, and the minimum pitch of SALELE may be around 40 nm.

However, as sizes of transistors and chips decrease, back-end metal pitches need to be less than approximately 40 nm to 30 nm or even smaller. The conventional self-aligned quadruple patterning (SAQP) method may achieve a smaller pitch. But like SADP, SAQP may have significant limitations in the design of metal wire layouts. Generally, in the design of metal wire layouts, the design freedom on a same chip needs to be taken into consideration, such as maximum pitch and minimum pitch, and freedom in determining metal wire positions. It may be difficult to achieve high design freedom with the SAQP process alone. In addition, without extreme ultraviolet (EUV) exposure, it may be difficult to simultaneously realize pitch miniaturization and design freedom by using the SAQP process of DUV lithography, and this may also pose great limitations to the production of chips with more advanced processes.

BRIEF SUMMARY OF THE DISCLOSURE

One aspect of the present disclosure includes a method of forming a semiconductor structure. The method includes providing a substrate, where the substrate includes a base and a target material layer located over the base, a second core material layer and a first core material layer located over the second core material layer are formed over the substrate, and the substrate includes a first region and a second region; patterning the first core material layer to form a first core layer separately located in the first region; forming a first spacer covering a sidewall of the first core layer; forming a first protection layer, where the first protection layer is separately located over the second core material layer in the second region, and covers the first spacer and the second core material layer in the first region; modifying a portion of the second core material layer in the second region using the first protection layer as a mask to form a third core material layer having an etching selectivity ratio with an unmodified portion of the second core material layer, where the unmodified portion of the second core material layer is separately located in the second region and is surrounded by the third core material layer of the second region; forming a second protection layer over the second core material layer and the third core material layer in the second region, where a plurality of second protection layer openings extending along a first direction and arranged in parallel with a second direction is formed in the second protection layer, and the first direction is perpendicular to the second direction; patterning the second core material layer and the third core material layer of the second region along the plurality of second protection layer openings of the second protection layer to form a second core layer corresponding to the second core material layer and a third core layer corresponding to the third core material layer; patterning the second core material layer in the first region using the first spacer as a mask to form a fourth core layer separately located in the first region; forming a second spacer covering sidewalls of the second core layer, the third core layer, and the fourth core layer; and patterning the target material layer using the second spacer and the third core layer as a mask, to form a first target structure located in the first region and a second target structure located in the second region, where the first target structure and the second target structure each extend along the first direction, and a pitch of adjacent first target structures of the first target structure is less than or equal to a pitch of adjacent second target structures of the second target structure.

As disclosed, the technical solutions of the present disclosure have the following advantages.

In the present disclosure, the substrate includes a first region for forming a plurality of first target structures, and a second region for forming a plurality of second target structures. The pitch of adjacent first target structures is less than or equal to the pitch of adjacent second target structures. The first target structures located in the first region and the second target structures located in the second region are formed by patterning the target material layer using the second spacer and the third core layer as a mask.

In the present disclosure, for the first region, SAQP processes are used in forming the first spacer covering the sidewall of the first core layer, patterning the second core material layer of the first region using the first spacer as a mask to form the fourth core layer separately located on the first region, forming the second spacer covering the sidewall of the fourth core layer, and patterning the target material layer using the second spacer as a mask. The SAQP process may form the first target structure with a relatively small pitch. For the second region, SALELE processes are used in modifying part of the second core material layer of the second region to transform a part of the second core material layer the third core material layer having an etching selectivity ratio with the second core material layer, patterning the second core material layer and the third core material layer of the second region using the second protection layer, forming the second core layer corresponding to the second core material layer and the third core layer corresponding to the third core material layer, forming the second spacer covering the sidewalls of the second core layer and the third core layer, and patterning the target material layer using the second spacer and the third core layer as a mask. That is, the present disclosure may integrate the SAQP process and the SALELE process. As a result, on a same substrate, the first target structure with a relatively small pitch and the second target structure with a relatively large pitch may each be formed. Accordingly, by process integration, more semiconductor process requirements may be met, and design freedom in the patterning process may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
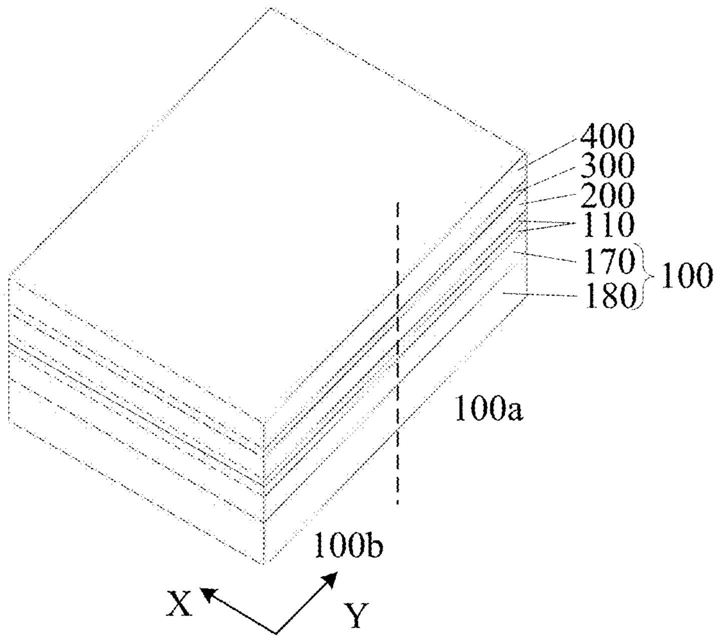
FIGS. 1 to 34 illustrate schematic structural diagrams corresponding to certain stages of an exemplary process of forming a semiconductor structure, consistent with the disclosed embodiments of the present disclosure.

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

As may be seen from the Background, a common solution in the back-end patterning is a self-aligned litho-etch-litho-etch (SALELE) process. The SALELE process has two core values of patterning. The first value is that the spacing between metal wires defined by the two lithos is determined by the thickness of the spacer during the process. The spacer is usually formed by an atomic layer deposition (ALD) process with high uniformity. As such the overlay of the two lithos may not cause changes in the spacing between two adjacent metal wires. Accordingly, the spacing between the metal wires may be uniform and fixed, and a large process window may be opened for reliability tests such as TDDB and VBD between metal wires. The second value is that the tip-to-tip distance of the metal wires defined by the two lithos may be made small by using other masks to generate patterning cuts. Moreover, the cut corresponding to the first litho and the cut corresponding to the second litho may not interfere with each other. This process is also known as the self-aligned block (SAB) process in the industry.

The above two advantages are the reasons why SALELE may balance the process difficulty and provide design freedom in the back-end patterning. SALELE may provide various similar solutions, such as the process solution disclosure in CN111640668B, and the process solution disclosed in U.S. Pat. No. 10,991,596B2.

In general, the minimum feature pitch of a single immersion DUV (ArFi) lithography is about 80 nm. Accordingly, SALELE may use DUV equipment to achieve a minimum pattern pitch of approximately 38 nm-40 nm. However, more advanced chips may require smaller pitches, such as 32 nm, 28 nm, 24 nm, etc.

In conventional fin patterning, when the pitch reaches around 30 nm, a self-aligned quadruple patterning (SAQP) process may be used. Since a self-aligned double patterning (SADP) process may only form fins with a minimum pitch of 38 nm, the SADP process may need to be repeated once more to become SAQP. An SAQP process may meet the needs of fin patterning, because the pattern of the fins may be relatively regular, the fin pitch of a chip within a region may be relatively fixed and regular, and the difference between regions may not be very large. However, the SAQP solution may have limitations in the back-end process where metal wires may have a high degree of freedom. For example, in the metal pattern formation of SRAM, the metal wires formed by patterning may be difficult to match with the pattern of the first metal layer of a conventional SRAM. Moreover, the width of the metal wires formed by SAQP may be relatively fixed, and the design of other bypass circuits may thus be difficult.

As such, in a same region of an existing semiconductor structure, back-end patterning may be difficult to simultaneously achieve pitch miniaturization and design freedom, may be difficult to meet more semiconductor process requirements, and may be difficult to improve the design freedom of the patterning process.

To solve the above technical problems, the present disclosure provides a method of forming a semiconductor structure. The method includes providing a substrate, where the substrate includes a base and a target material layer located over the base, a second core material layer and a first core material layer located over the second core material layer are formed over the substrate, and the substrate includes a first region and a second region; patterning the first core material layer to form a first core layer separately located in the first region; forming a first spacer covering a sidewall of the first core layer; forming a first protection layer, where the first protection layer is separately located over the second core material layer in the second region, and covers the first spacer and the second core material layer in the first region; modifying a portion of the second core material layer in the second region using the first protection layer as a mask to form a third core material layer having an etching selectivity ratio with an unmodified portion of the second core material layer, where the unmodified portion of the second core material layer is separately located in the second region and is surrounded by the third core material layer of the second region; forming a second protection layer over the second core material layer and the third core material layer in the second region, where a plurality of second protection layer openings extending along a first direction and arranged in parallel with a second direction is formed in the second protection layer, and the first direction is perpendicular to the second direction; patterning the second core material layer and the third core material layer of the second region along the plurality of second protection layer openings of the second protection layer to form a second core layer corresponding to the second core material layer and a third core layer corresponding to the third core material layer; patterning the second core material layer in the first region using the first spacer as a mask to form a fourth core layer separately located in the first region; forming a second spacer covering sidewalls of the second core layer, the third core layer, and the fourth core layer; and patterning the target material layer using the second spacer and the third core layer as a mask, to form a first target structure located in the first region and a second target structure located in the second region, where the first target structure and the second target structure each extend along the first direction, and a pitch of adjacent first target structures of the first target structure is less than or equal to a pitch of adjacent second target structures of the second target structure.

In one embodiment, for the first region, SAQP processes are used in forming the first spacer covering the sidewall of the first core layer, patterning the second core material layer of the first region using the first spacer as a mask to form the fourth core layer separately located on the first region, forming the second spacer covering the sidewall of the fourth core layer, and patterning the target material layer using the second spacer as a mask. The SAQP process may form the first target structure with a relatively small pitch. For the second region, SALELE processes are used in modifying part of the second core material layer of the second region to transform a part of the second core material layer the third core material layer having an etching selectivity ratio with the second core material layer, patterning the second core material layer and the third core material layer of the second region using the second protection layer, forming the second core layer corresponding to the second core material layer and the third core layer corresponding to the third core material layer, forming the second spacer covering the sidewalls of the second core layer and the third core layer, and patterning the target material layer using the second spacer and the third core layer as a mask. That is, the present disclosure may integrate the SAQP process and the SALELE process. As a result, on a same substrate, the first target structure with a relatively small pitch and the second target structure with a relatively large pitch may each be formed. Accordingly, by process integration, more semiconductor process requirements may be met, and design freedom in the patterning process may be improved.

Figure 34:
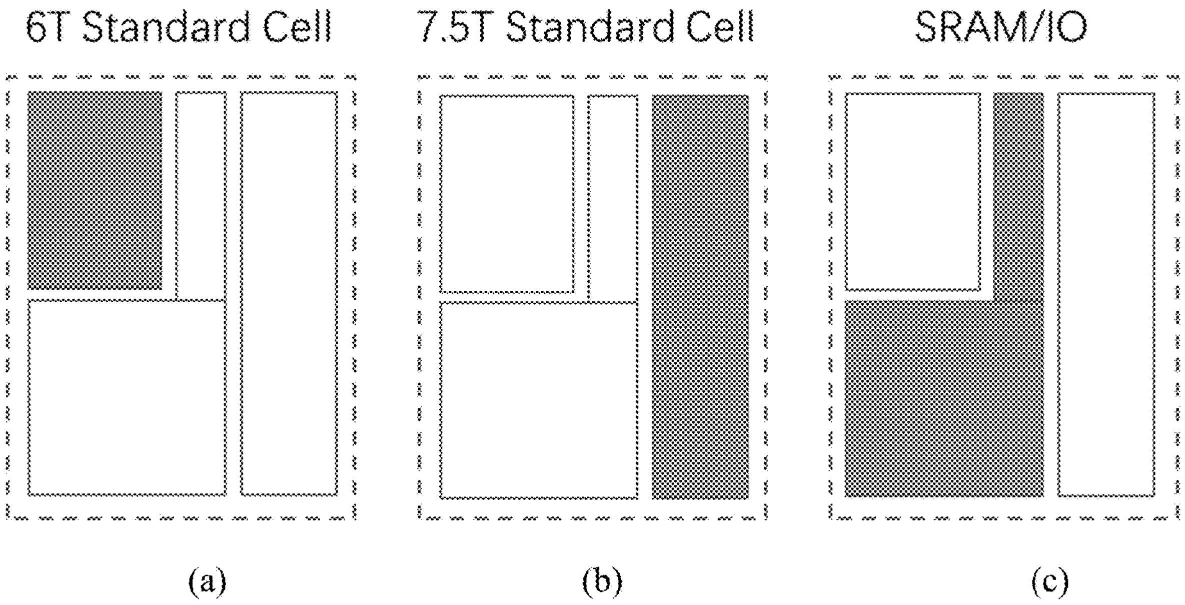
Figure 35:
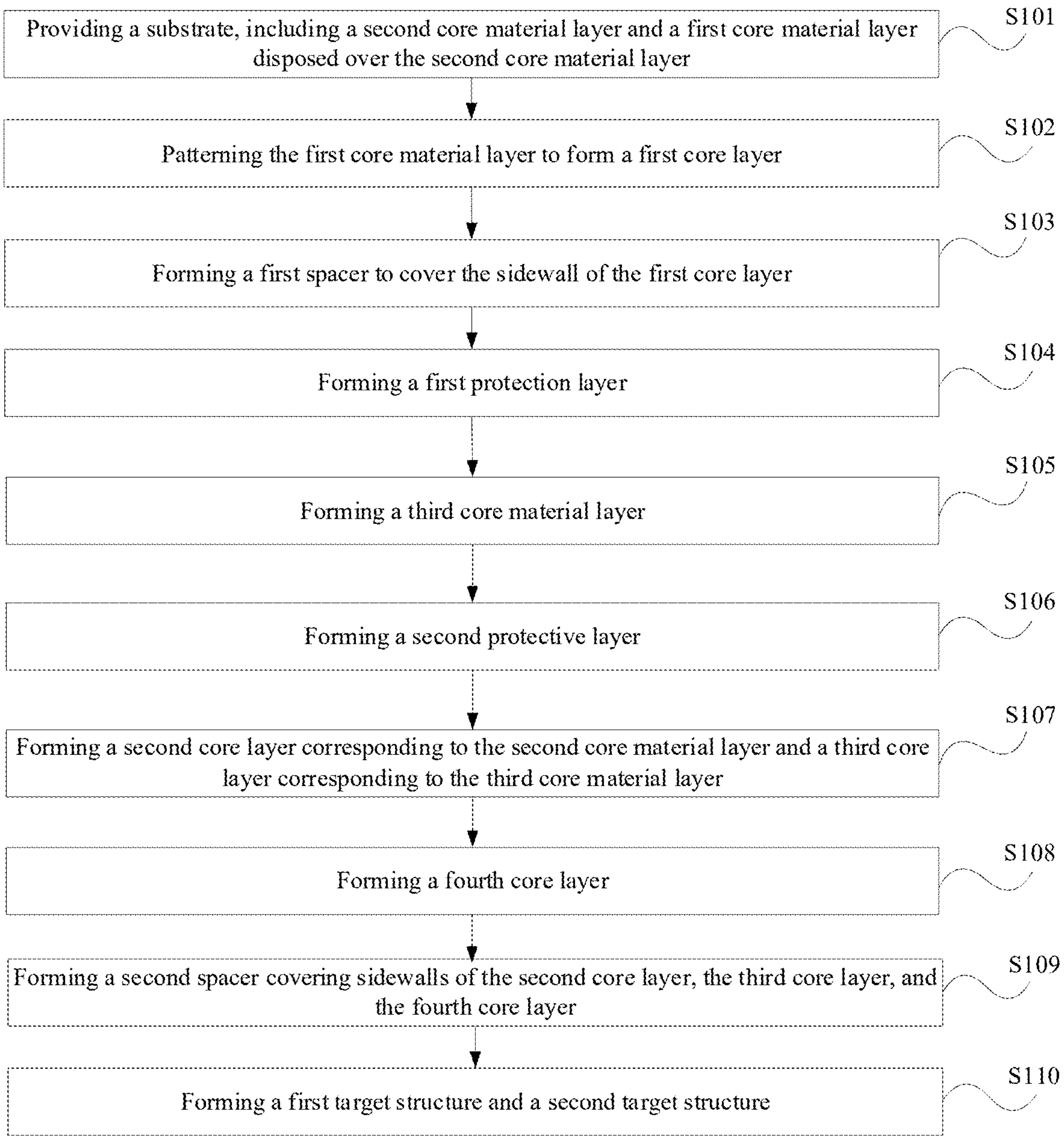
FIG. 35 illustrates a flowchart of an exemplary process of forming a semiconductor structure, consistent with the disclosed embodiments of the present disclosure.

FIG. 35 illustrates a flowchart of an exemplary process of forming a semiconductor structure, consistent with the disclosed embodiments of the present disclosure. FIGS. 1 to 34 illustrate schematic structural diagrams corresponding to certain stages of an exemplary process of forming a semiconductor structure, consistent with the disclosed embodiments of the present disclosure.

As shown in FIG. 35, at the beginning of the forming process, a substrate is provided (S101). FIG. 1 illustrates a corresponding semiconductor structure.

Referring to FIG. 1, a substrate 100 is provided. The substrate 100 includes a base 180 and a target material layer 170 disposed over the base 180. A second core material layer 200 and a first core material layer 400 disposed over the second core material layer 200 are formed over the substrate 100. The substrate 100 includes a first region 100*a* for forming a plurality of first target structures, and a second region 100*b* for forming a plurality of second target structures. The first target structures and the second target structures each extend along a first direction (X direction in FIG. 1). A pitch of adjacent first target structures is less than or equal to a pitch of adjacent second target structures.

The substrate 100 provides a process operation basis for the process of forming the semiconductor structure. The semiconductor structure includes metal interconnects, barrier layers, adhesion layers, cap layers, and the like. In one embodiment, the base 180 is a wafer on which transistors and part of wirings are formed.

In one embodiment, the substrate 100 includes the first region 100*a* for forming a plurality of first target structures, and the second region 100*b* for forming a plurality of second target structures. A pitch of adjacent first target structures is less than or equal to a pitch of adjacent second target structures.

It should be noted that, in the process of forming the semiconductor structure, it may be necessary to form a dense first target structure and a sparse second target structure. That is, the pitch of the adjacent first target structures may be less than or equal to the pitch of adjacent second target structures. However, the SAQP process may form a dense target structure, but may be difficult to form a sparse target structure. Moreover, the pitch between target structures may be relatively fixed and difficult to adjust according to layout requirements. The SALELE process may define the pitch between target structures according to the layout, the pitch may be adjusted, and a self-aligned block process may be realized. However, The SALELE process is difficult to form dense target structures (with pitch less than approximately 38 nm). Specifically, in one embodiment, the first region 100*a* is realized by using a SAQP process, and the second region 100*b* is realized by using an SALELE process. As such, the substrate 100 includes the first region 100*a* for forming a plurality of first target structures, and the second region 100*b* for forming a plurality of second target structures. That is, the present disclosure may simultaneously form a first target structure with a small pitch that may be difficult to be formed by the SALELE process, and a second target structure with a large pitch and more flexible design that may be difficult to be formed by the SAQP process on a same substrate 100 (for example, a same wafer).

In one embodiment, the first region 100*a* includes a logic device area, and the second region 100*b* includes a peripheral device area. The patterns in the logic device area are dense, while the patterns in the peripheral device area are sparse. Specifically, the logic device area includes device areas such as the central processing unit (CPU) and the graphics processing unit (GPU). The peripheral device area includes device areas such as the static random-access memory (SRAM) and input and output (IO) devices.

In one embodiment, the pitch of adjacent first target structures is approximately 24 nm to 38 nm, and the pitch of adjacent second target structures is approximately 38 nm to 200 nm.

The first target structure may be formed by the SAQP process, and the second target structure may be formed by the SALELE process. Accordingly, the first target structure with a pitch of approximately 24 nm to 38 nm and the second target structure with a pitch of approximately 38 nm to 200 nm may be formed on the same substrate 100.

In one embodiment, the thickness of the gate oxide layer in the logic device area is smaller than the thickness of the gate oxide layer in the peripheral device area. In general, the operating voltage of CPU or GPU transistors is lower than the operating voltage of transistors in the IO device area. For example, the operating voltage of CPU transistors is approximately 0.75V, while the operating voltage of transistors in the IO device area is approximately 1.2V or even approximately 1.8V. Accordingly, in general, for the sake of reliability and electrical performance of transistors in the IO device area, the gate oxide layer of transistors in the IO device area is thicker than the gate oxide layer of transistors in the logic device area. The difference in thickness mainly comes from the thickness of the interface layer (i.e., silicon oxide layer) between the high-k (HK) dielectric layer in the high-k metal gate (HKMG) and the transistor channel. That is, the interface layer in the gate oxide layer of the logic device area is thinner than the interface layer in the IO device area, while the HK dielectric layers above the interface layers in the two areas may have a same thickness. The interface layer and the HK dielectric layer together form the gate dielectric layer of the corresponding transistor. Accordingly, the thickness of the gate oxide layer in the logic device area is less than the thickness of the gate oxide layer in the peripheral device area.

The target material layer 170 is configured to provide a process platform for forming the first target structure and the second target structure. In one embodiment, in the process of providing the substrate 100, the target material layer 170 is a dielectric layer, the first target structure is a first trench, and the second target structure is a second trench. The first trench and the second trench provide space for subsequent processes. The target material layer 170 is a dielectric layer used to partition the structures formed in the first trench and the second trench.

In one embodiment, the dielectric layer is made of a material including silicon oxide, silicon nitride, silicon oxynitride, silicon oxycarbide, silicon carbonitride, silicon carbon oxynitride, low-K dielectric layer (LK), ultralow-K dielectric layer (ULK), or a combination thereof.

In one embodiment, in the process of providing the substrate 100, a mask material layer 110 is also formed between the target material layer 170 and the second core material layer 200. The mask material layer 110 is configured to subsequently form a second pattern transfer layer. Specifically, in one embodiment, the mask material layer 110 is a stacked structure, including a titanium nitride layer and a silicon oxide layer located over the titanium nitride layer.

The second core material layer 200 is configured to subsequently form a second core layer, a third core layer and a fourth core layer.

In one embodiment, after the second core layer and the fourth core layer are formed, the second core layer and the fourth core layer are removed. As such, the second core material layer 200 is made of a material that may be easy to remove, thereby reducing the difficulty of removing the second core layer and the fourth core layer and reducing damage to other film layers located below the second core material layer 200. Accordingly, the second core material layer 200 is made of a material including amorphous silicon, polycrystalline silicon, single crystal silicon, silicon oxide, advanced patterning film (APF) material, spin-on carbon (SOC), silicon carbide, or a combination thereof. In one embodiment, the second core material layer 200 is made of amorphous silicon (a-Si).

In one embodiment, in the process of providing the substrate 100, an etching stop layer 300 is also formed between the first core material layer 200 and the second core material layer 400. The etching stop layer 300 is configured to subsequently form a first pattern transfer layer. The etch stop layer 300 may also be used as an etch stop layer when the first core material layer 400 is subsequently patterned. The etch stop layer 300 may also protect the second core material layer 200 to prevent the second core material layer 200 from being damaged.

In one embodiment, the etch stop layer 300 is made of a material including silicon oxide, silicon nitride, silicon oxynitride, silicon carbide, titanium, titanium oxide, titanium nitride, tantalum, tantalum oxide, tantalum nitride, boron nitride, copper nitride, aluminum nitride, tungsten nitride, or a combination thereof. In one embodiment, the etch stop layer 300 is made of silicon oxide.

The first core material layer 400 is configured to subsequently form a first core layer. In one embodiment, after the first core layer is subsequently formed, the first core layer may be subsequently removed. As such, the first core material layer 400 is made of a material that may be easy to remove, thereby reducing the difficulty of removing the first core layer and reducing damage to other film layers located below the first core material layer 400. Accordingly, the first core material layer 400 is made of a material including amorphous silicon, polycrystalline silicon, single crystal silicon, silicon oxide, advanced patterning film (APF) material, spin-on carbon (SOC), silicon carbide, or a combination thereof. In one embodiment, the first core material layer 400 is made of amorphous silicon (a-Si).

Figure 2:
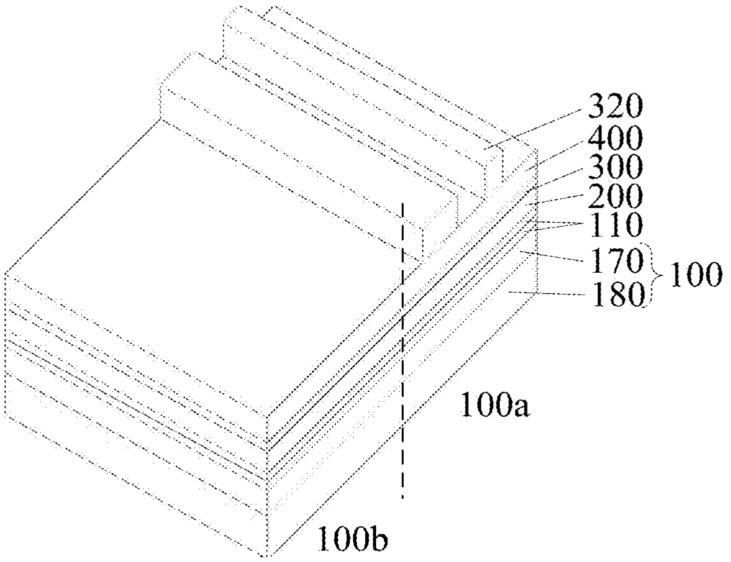
Figure 3:
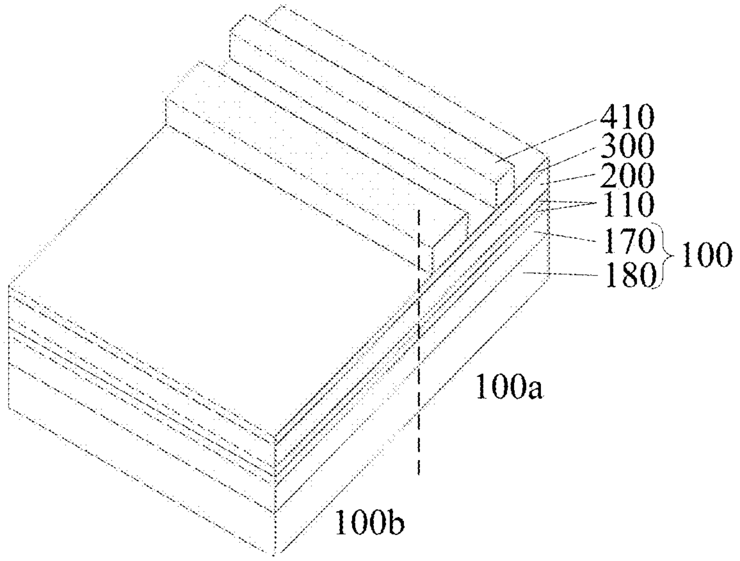

Returning to FIG. 35, after providing the substrate, the first core material layer may be patterned to form a first core layer (S102). FIGS. 2 and 3 illustrate corresponding semiconductor structures.

Referring to FIGS. 2 and 3, the first core material layer 400 is patterned to form a first core layer 410 separately located in the first region 100*a*. The first core layer 410 is configured to provide support for subsequent formation of a first sidewall.

In one embodiment, the first core material layer 400 is patterned by a dry etching process. Dry etching of amorphous silicon may stop on the silicon oxide material used as the first etch stop layer 300.

The dry etching process is a dry etching process with anisotropic etching characteristics. For dry etching, the longitudinal etching rate may be greater than the lateral etching rate. Accordingly, by selecting a dry etching process, the pattern transfer accuracy may be improved. In addition, since dry etching may have good etching directionality, the sidewall morphology quality and dimensional accuracy of the first core layer 410 may be improved.

In one embodiment, the first core layer 410 is made of amorphous silicon (a-Si). Accordingly, in the process of patterning the first core material layer 400, the damage to the etch stop layer 300 may be reduced. After patterning the first core material layer 400, the etch stop layer 300 may still maintain a good size and morphology accuracy. Furthermore, since the first core layer 410 is made of a material that may be easy to remove, the subsequent process of removing the first core layer 410 may have little effect on the etch stop layer 300.

It should be noted that, in one embodiment, the size and pitch of the first core layer 410 are set according to the size and pitch of the first target structure subsequently formed in the first region 100*a*.

Referring to FIG. 2, the process of patterning the first core material layer 400 includes forming a first mask layer 320 separately located over the first core material layer 400 in the first region 100*a*.

The first mask layer 320 is configured to be an etching mask for patterning the first core material layer 400. In one embodiment, the first mask layer 320 includes an SOC layer, an anti-reflective coating layer (Si-ARC) on the SOC layer, and a photoresist layer on the Si-ARC. The first mask layer 320 may be formed through photolithography and a plurality of etching processes.

Referring to FIG. 3, the first core material layer 400 is patterned along the first mask layer 320 to form the first core layer 410 separately located over the first region 100*a*.

In one embodiment, after forming the first core layer 410, the process further includes: removing the first mask layer 320. The first mask layer 320 may be removed to prepare for subsequently forming a first spacer.

Figure 4:
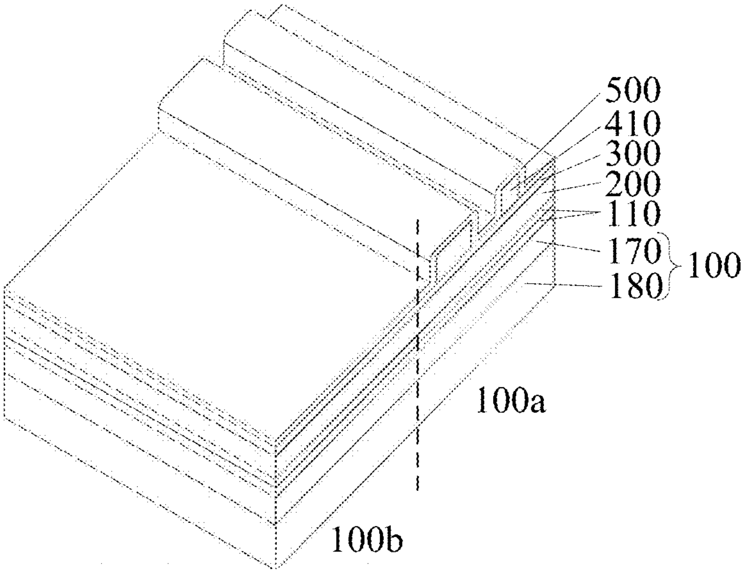
Figure 5:
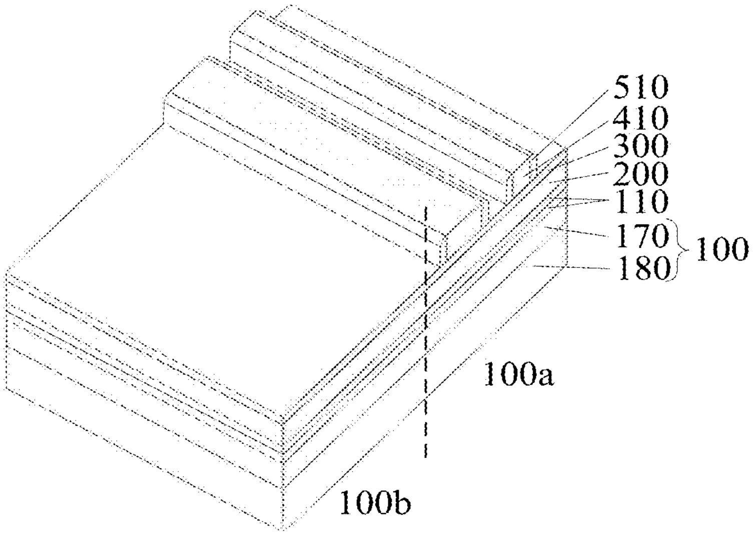

Returning to FIG. 35, after forming the first core layer, a first spacer may be formed to cover the sidewall of the first core layer (S103). FIGS. 4 and 5 illustrate corresponding semiconductor structures.

Referring to FIGS. 4 and 5, a first spacer 510 is formed to cover the sidewall of the first core layer 410. The first spacer 510 is configured to be an etching mask for subsequent patterning of the second core material layer 200. In one embodiment, the first spacer 510 is made of a material including titanium oxide, titanium nitride, silicon oxide, silicon nitride, silicon oxynitride, silicon carbide, or a combination thereof. Titanium oxide, titanium nitride, silicon oxide, silicon nitride, silicon oxynitride and silicon carbide may form a good etching selectivity ratio with the first core layer 410. Accordingly, damage to the first spacer 510 in the subsequent process of removing the first core layer 410 may be reduced.

Referring to FIG. 4, the process of forming the first spacer 510 covering the sidewall of the first core layer 410 includes: forming a first spacer material layer 500 covering the sidewall and top of the first core layer 410 and the top of the etch stop layer 300.

Specifically, in one embodiment, the first spacer material layer 500 covers the sidewall and top of the first core layer 410, and the top of the etch stop layer 300. The first spacer material layer 500 is configured to directly form the first spacer 510. The first spacer material layer 500 is made of a material including titanium oxide, titanium nitride, silicon oxide, silicon nitride, silicon oxynitride, silicon carbide, or a combination thereof.

In one embodiment, an atomic layer deposition process is used to form the first spacer material layer 500 covering the sidewall and top of the first core layer 410 and the top of the etch stop layer 300. The first spacer material layer 500 formed by the atomic layer deposition process may have good thickness uniformity and good step coverage capability. Accordingly, the first spacer material layer 500 may conformally cover the sidewall and top of the first core layer 410 and the top of the etch stop layer 300.

Referring to FIG. 5, the first spacer material layer 500 disposed on the top of the first core layer 410 and the top of the top of the etch stop layer 300 may be removed, and the first spacer material layer 500 located on the sidewall of the first core layer 410 may be retained as the first spacer 510.

Specifically, in one embodiment, the first spacer material layer 500 disposed on the top of the first core layer 410 and the top of the etch stop layer 300 is removed.

In one embodiment, a dry etching process is used to remove the first spacer material layer 500 on the top of the first core layer 410 and the top of the etch stop layer 300. The dry etching process is an anisotropic dry etching process. As such, by selecting the dry etching process, the damage to the first core layer 410 and the etching stop layer 300 may be reduced. In addition, since dry etching may have better etching directionality, the sidewall morphology quality and dimensional accuracy of the first spacer 510 may be improved.

Figure 6:
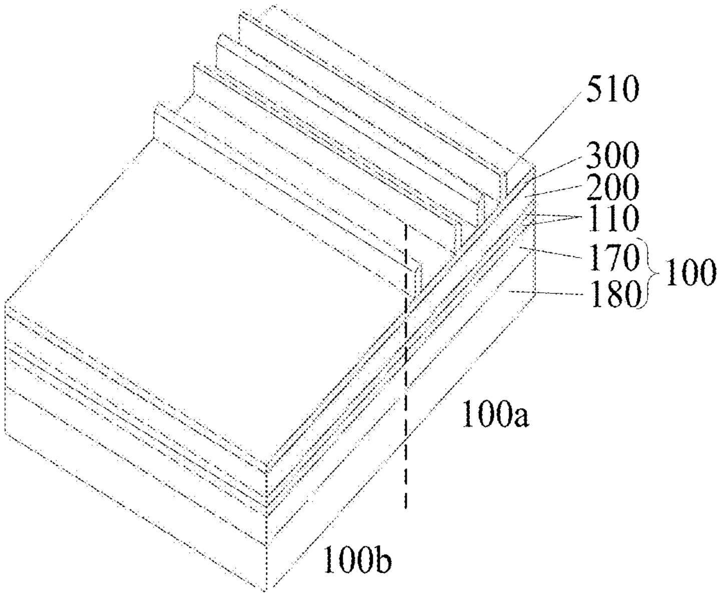

Referring to FIG. 6, after forming the first spacer 510, the process also includes: removing the first core layer 410. The first core layer 410 is removed to prepare for the subsequent patterning of the etch stop layer 300 and the second core material layer 200 using the first spacer 510 as a mask.

In one embodiment, a wet etching process is used to remove the first core layer 410. The wet etching process may have the characteristic of isotropic etching, and the first core layer 410 may be fully removed. Moreover, the cost of the wet etching process may be low, the operation process may be simple, and the etching selectivity ratio may be large. Accordingly, damage to the first spacer 510 during the process of removing the first core layer 410 may be reduced.

Figure 7:
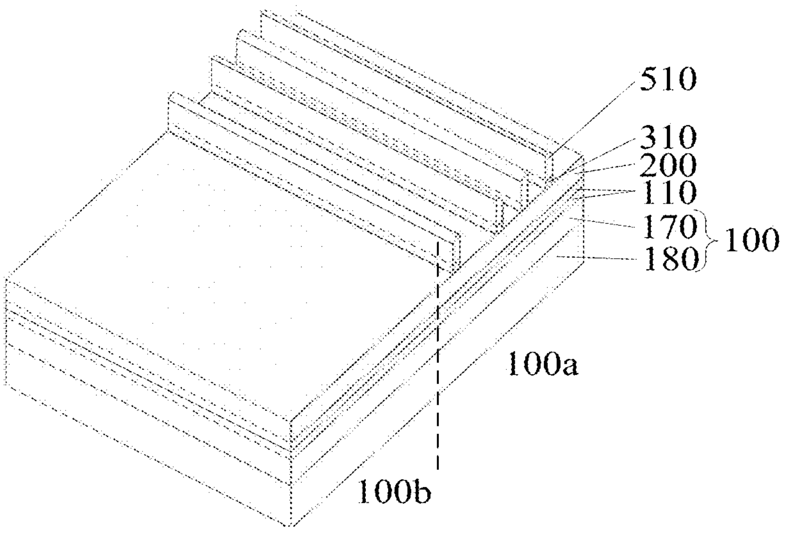

Referring to FIG. 7, before modifying a portion of the second core material layer 200 in the second region 100*b* using a first protection layer as a mask, the process also includes: patterning the etch stop layer 300 using the first spacer 510 as a mask to form a first pattern transfer layer 310. The first pattern transfer layer 310 may be used as an etching mask for subsequent patterning of the second core material layer 200 in the first region 100*a*.

Figure 8:
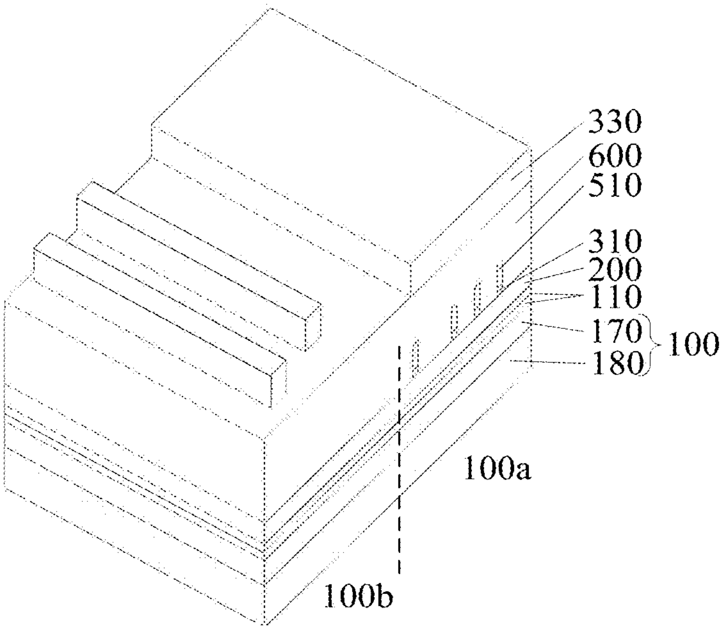
Figure 9:
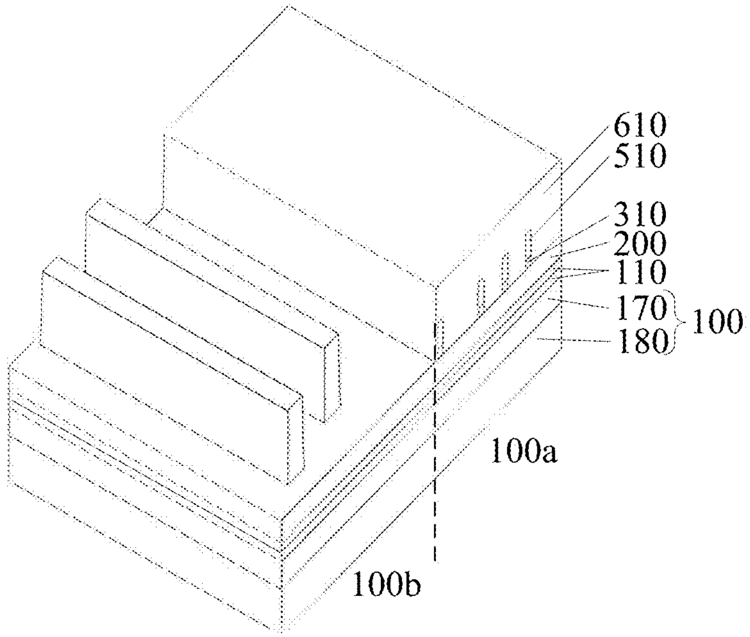

Returning to FIG. 35, after forming the first spacer, a first protection layer may be formed (S104). FIGS. 8 and 9 illustrate corresponding semiconductor structures.

Referring to FIGS. 8 and 9, after removing the first core layer 410, a first protection layer 610 is formed. The first protection layer 610 is separately located over the second core material layer 200 in the second region 100*b* and covers the second core material layer 200 and the first spacer 510 in the first region 100*a*.

The first protection layer 610 of the first region 100*a* is configured to cover the first region 100*a* and protect the first spacer 510 and the second core material layer 200 of the first region 100*a* from damage. The first protection layer 610 of the second region 100*b* may be used as an implantation mask for subsequent ion implantation of the second core material layer 200 of the second region 100*b*. In one embodiment, the first protection layer 610 is made of a material including spin-on carbon (SOC) material.

Specifically, referring to FIG. 8, a process of forming a first protection layer 610 separately located on the second core material layer 200 in the second region 100*b* and covering the second core material layer 200 and the first spacer 510 in the first region 100*a* includes: forming a first protective material layer 600 covering the second core material layer 200 and the first spacer 510. The first protective material layer 600 is configured to form a first protection layer 610.

In one embodiment, the first protective material layer 600 is a planarization layer. The first protective material layer 600 is made of a material including a spin-on carbon (SOC) material. Spin-on carbon may be formed by a spin-coating process, and the process cost may be low. Moreover, by using spin-on carbon, the flatness of the top surface of the first protective material layer 600 may be improved, and a good interface for the formation of the first protection layer may be provided.

In one embodiment, the first protective material layer 600 also covers the sidewalls of the first pattern transfer layer 310 in the first region 100*a*.

In one embodiment, a second mask layer 330 is formed on the first protective material layer 600. The second mask layer 330 covers the first protection material layer 600 in the first region 100*a* and is separately located on the first protection material layer 600 in the second region 100*b*. The second mask layer 330 is configured to pattern the first protection material layer 600.

In one embodiment, the second mask layer 330 includes an anti-reflective coating (Si-ARC) and a photoresist layer on the anti-reflective coating (Si-ARC).

Referring to FIG. 9, the first protection material layer 600 located in the second region 100*b* is patterned to form the first protection layer 610. The first protection layer 610 includes the first protection layer 610 separately located on the second region 100*b* and the first protection material layer 600 remained for covering the second core material layer 200 in the first region 100*a*. Specifically, in one embodiment, the first protection material layer 600 is patterned using the second mask layer 330 as an etching mask.

In one embodiment, after patterning the first protection material layer 600 located in the second region 100*b*, the process also includes: removing the second mask layer 330.

Figure 10:
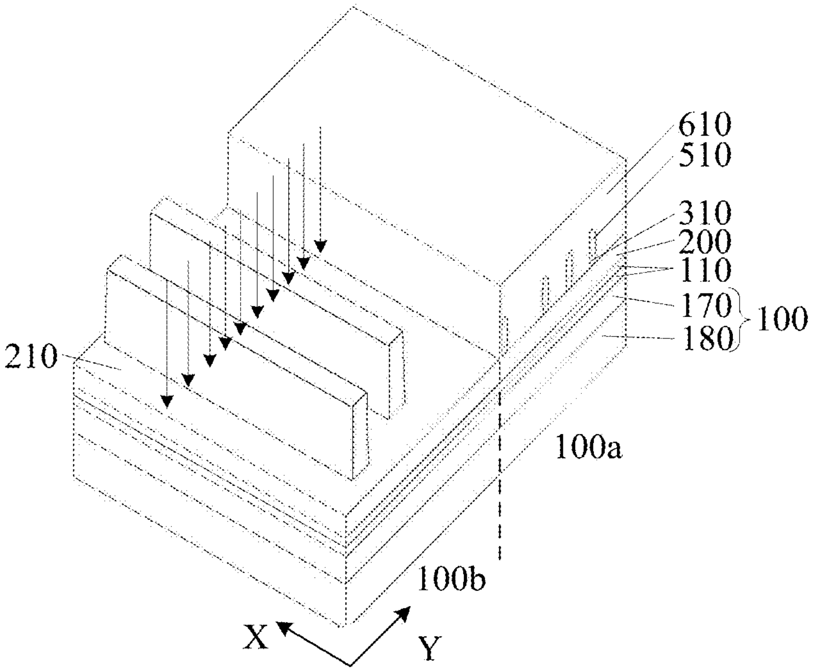
Figure 11:
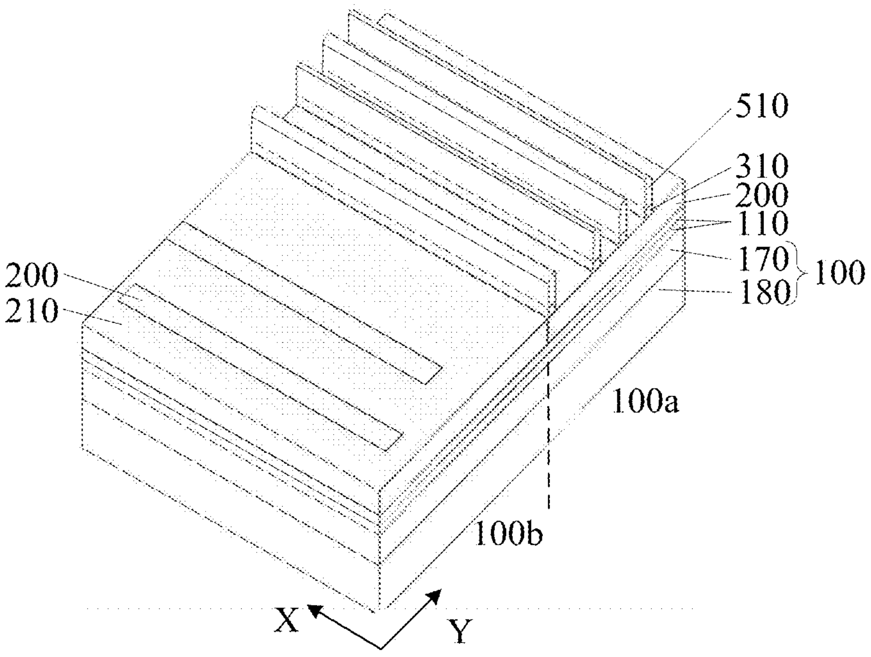

Returning to FIG. 35, after forming the first protection layer, a third core material layer having an etching selectivity ratio with the remaining second core material layer may be formed (S105). FIGS. 10 and 11 illustrate corresponding semiconductor structures.

Referring to FIG. 10, a portion of the second core material layer 200 in the second region 100 *b* is modified using the first protection layer 610 as a mask to form a third core material layer 210 having an etching selectivity ratio with the remaining second core material layer 200. The remaining second core material layers 200 are separately located in the second region 100*b* and are surrounded by the third core material layer 210 of the second region 100*b*.

A modification treatment is performed on a portion of the second core material layer 200 in the second region 100*b* to obtain a third core material layer 210 having an etching selectivity ratio with the second core material layer 200. As such, the remaining second core material layer 200 may be easily removed later, and damage to the third core material layer 210 during the process of removing the remaining second core material layer 200 may be reduced. The third core material layer 210 may be used to prepare for the subsequent patterning of the target material layer 170 in the second region 100*b*.

Referring to FIG. 10, in the process of modifying a portion of the second core material layer 200 in the second region 100*b* using the first protection layer 610 as a mask, the second core material layer 200 is ion implanted using the first protection layer 610 as a mask, and a third core material layer 210 having an etching selectivity ratio with the remaining second core material layer 200 is formed.

The ion implantation process may have characteristics of uniform large-area ion implantation, more accurate control of ion doping depth, and high repeatability. Since the third core material layer 210 is obtained by ion implantation, the doping concentration and distribution of the third core material layer 210 and the penetration depth into the second core material layer 200 may be controlled. Accordingly, the ion distribution in the third core material layer 210 may be uniform.

In one embodiment, in the process of performing ion implantation on the second core material layer 200 using the first protection layer 610 as a mask, the ions implanted by the ion implantation include boron, phosphorus, arsenic, boron chloride, boron dichloride, carbon, or a combination thereof.

In one embodiment, the second core material layer 200 is made of a material including amorphous silicon. Injecting ions of boron, phosphorus, arsenic, boron chloride, boron dichloride, carbon, or a combination thereof, into the second core material layer 200 may convert amorphous silicon into a material having a high etching selectivity ratio with amorphous silicon. As such, the third core material layer 210 having a high etching selectivity ratio with the second core material layer 200 may be obtained.

It should be noted that, in one embodiment, a photomask and a photolithography process are used to pattern the second mask layer 330 located in the second region 100*b* and the second mask layer 330 located in the first region 100*a*. The first protective material layer 600 is patterned with the second mask layer 330 to form the first protection layer 610. Then, the second core material layer 200 is ion implanted using the first protection layer 610 as a mask to form the third core material layer 210 having an etching selectivity ratio with the second core material layer 200. The process for forming the first protection layer 610 may have high flexibility, and the width and pitch of the first protection layer 610 may be adjusted. Accordingly, the width and pitch of the remaining second core material layer 200 located in the second region 100*b* may be adjusted. As such, a portion of the second target structure with a large pitch may be obtained in the second region 100*b*, and freedom of patterning design may be improved.

Specifically, in one embodiment, in the process of modifying a portion of the second core material layer 200 in the second region 100*b* using the first protection layer 610 as a mask, the remaining second core material layer 200 has a size of approximately 35 nm to 200 nm along the second direction (Y direction in FIG. 10) and a pitch of approximately 76 nm to 200 nm. The third core material layer 210 has a size of approximately 35 nm to 200 nm along the second direction and a pitch of 76 nm to 200 nm.

It should be noted that, in one embodiment, the second mask layer 330 located in the first region 100 *a* is not removed when the second mask layer 330 is patterned by using a photomask and a photolithography and etching process. The first protection layer 610 located in the first region 100*a* still covers the first spacer 510 located in the first region 100*a* and the second core material layer 200 located in the first region 100*a*. As such, the second core material layer 200 located in the first region 100*a* may not be modified into the third core material layer 210.

Referring to FIG. 11, after forming the third core material layer 210, the process also includes: removing the first protection layer 610. The first protection layer 610 is removed to prepare for the subsequent formation of the second protection layer. In one embodiment, an etching process is used to remove the first protection layer 610.

In one embodiment, either an isotropic etching process or an anisotropic etching process may be used, provided that the required etching selectivity ratio of the etching process is met. The etching process has a relatively large etching selectivity for the first protection layer 610 with the first spacer 510. Accordingly, damage to the first spacer 510 during the process of removing the first protection layer 610 may be reduced.

Figure 12:
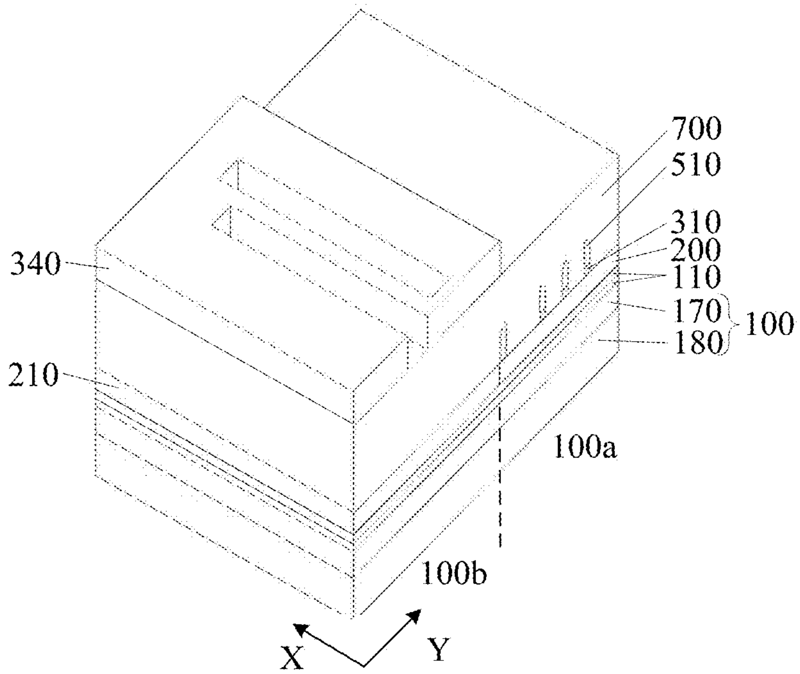
Figure 13:
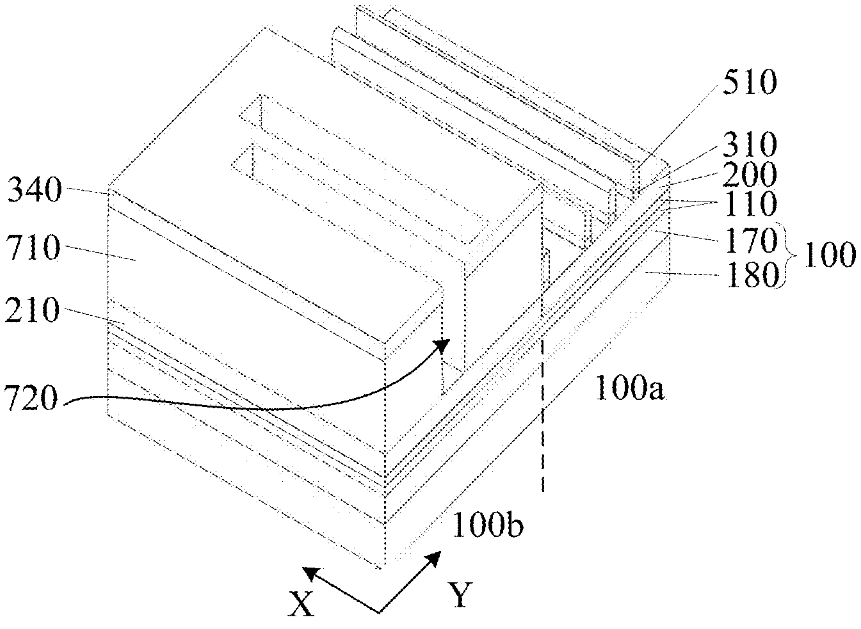

Returning to FIG. 35, after forming the third core material layer, a second protection layer may be formed (S106). FIGS. 12 and 13 illustrate corresponding semiconductor structures.

Referring to FIGS. 12 and 13, a second protection layer 710 is formed on the second core material layer 200 and the third core material layer 210 in the second region 100*b*. The second protection layer 710 has second protection layer openings 720 extending along the first direction and arranged in parallel along the second direction. The first direction is perpendicular to the second direction. The second protection layer 710 may be used as an etching mask for subsequent patterning of the second core material layer 200 and the third core material layer 210.

In one embodiment, the second protection layer 710 is formed by patterning the planarization layer. The second protection layer 710 is made of a material including a spin-on carbon (SOC) material or SOC and a remaining portion of the third mask layer 340. Whether the third mask layer 340 remains or not is related to the process selection and does not affect the subsequent processes. The spin-on carbon may be formed by a spin-coating process, and the process cost may be low. Moreover, by using spin-on carbon, the flatness of the top surface of the planarization layer may be improved, and a good interface for the formation of the second protection layer 710 may be provided.

Referring to FIG. 12, the process of forming the second protection layer 710 on the second core material layer 200 and the third core material layer 210 in the second region 100*b* includes: forming a second protection material layer 700 covering the second core material layer 200, the third core material layer 210, the first spacer 510, and the sidewall of the first pattern transfer layer 310.

In one embodiment, a third mask layer 340 is also formed on the second protective material layer 700. The third mask layer 340 exposes the second protection material layer 700 in the first region 100*a* and is located on the second protection material layer 700 in the second region 100*b*. The third mask layer 340 is configured to pattern the second protection material layer 700.

In one embodiment, the third mask layer 340 includes an anti-reflective coating (Si-ARC) and a photoresist layer on the anti-reflective coating (Si-ARC).

It should be noted that, in one embodiment, one photomask and related photolithography and etching processes are used to pattern the third mask layer 340 located in the first region 100*a* and the second region 100*b*. The second protective material layer 700 is patterned with the third mask layer 340 to form a second protection layer 710. Then, the second core material layer 200 and the third core material layer 210 are patterned using the second protection layer 710 located in the second region 100*b* and the first spacer 510 located in the first region 100*a* as a mask. Accordingly, a third core layer 230 with an etching selectivity ratio with the second core layer 220 and a fourth core layer 240 located under the first spacer 510 of the first region are formed.

Since the process of forming 340 by using one mask may be flexible and diverse patterns may be achieved, the process may have design freedom within the range allowed by single lithography. That is, the size and pitch of the second protection layer opening 720 in the second protection layer 710 may be adjusted, provided that the size and pitch of the second protection layer opening 720 are within the single DUV lithography limit and the pitch is greater than approximately 76 nm. Accordingly, the relative size and pitch of the trench 950 formed by the second spacer material layer 800 supported by the sidewalls of the second core layer 220 and the third core layer 230 may be designed with freedom. As such, a portion of the second target structures with a large partial pitch may be obtained in the second region 100*b*, and the freedom of patterning design may be improved.

Referring to FIG. 13, the second protective material layer 700 is patterned. The second protective material layer 700 in the first region 100*a* is removed, exposing the first spacer 510 in the first region 100*a*. A plurality of the second protective material layers 700 of a partial length extending along the first direction and a partial width along the second direction in the second region 100*b* is removed. The remaining second protection material layer 700 located in the second region 100*b* is retained as a second protection layer 710.

Specifically, in one embodiment, the second protection material layer 700 is patterned using the third mask layer 340 as an etching mask.

In one embodiment, after forming the second protection layer 710 separately located on the second core material layer 200 and the third core material layer 210 in the second region 100*b*, the process also includes: removing the third mask layer 340.

Figure 14:
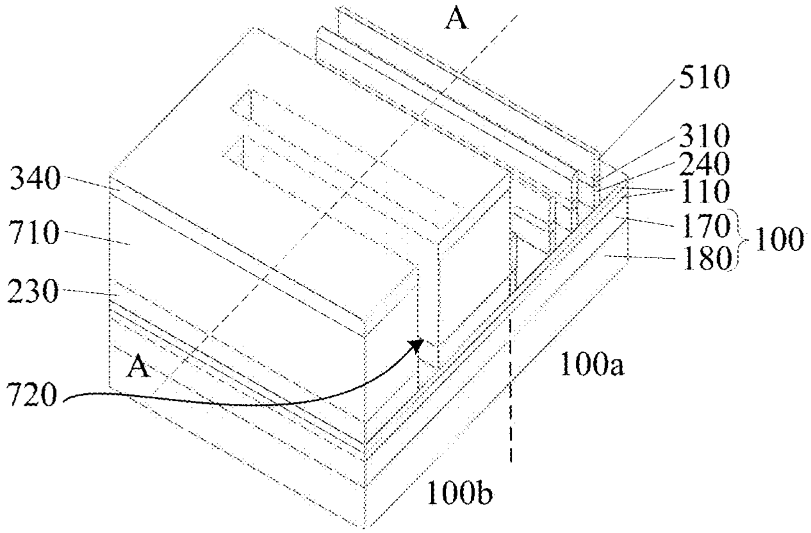
Figure 15:
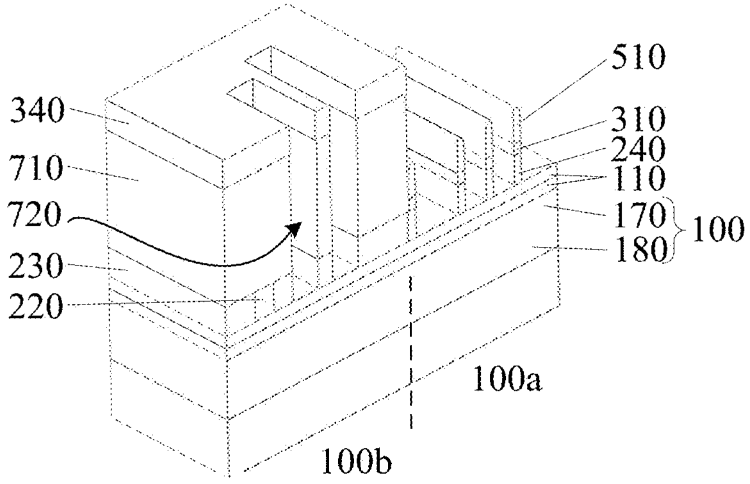

Returning to FIG. 35, after forming the second protection layer, a second core layer corresponding to the second core material layer and a third core layer corresponding to the third core material layer may be formed (S107). FIGS. 14 and 15 illustrate corresponding semiconductor structures. FIG. 15 is a cross-sectional view taken along the AA direction of FIG. 14.

Referring to FIGS. 14 and 15, the second core material layer 200 and the third core material layer 210 of the second region 100*b* are patterned along the second protection layer opening 720 of the second protection layer 710. A second core layer 220 corresponding to the second core material layer 200 and a third core layer 230 corresponding to the third core material layer 210 are then formed.

It should be noted that the second core layer 220 is formed by patterning the second core material layer 200 of the second region 100*b*. The third core layer 230 is formed by patterning the third core material layer 210 of the second region 100*b*. The etching selectivity of the second core material layer 200 and the third core material layer 210, generated due to the modification process, may not disappear due to the patterning process. That is, the second core layer 220 and the third core layer 230 may still retain a high etching selectivity ratio. For example, during the etching process of KOH or SC1 solution, the second core layer 220 may be removed at a faster etching rate, while the third core layer 230 may be hardly etched.

After the second core layer 220 is subsequently removed, the third core layer 230, as a partial etching mask for the target material layer 170 of the subsequent patterning of the second region 100*b*, may also provide support for the subsequent formation of the second spacer.

In one embodiment, the second core layer 220 is made of a material including amorphous silicon (a-Si), and the third core layer 230 is made of a material including amorphous silicon doped with boron, phosphorus, arsenic, or a combination thereof.

Returning to FIG. 35, after forming the second core and the third core layer, a fourth core layer may be formed (S108). FIGS. 14 and 15 illustrate corresponding semiconductor structures.

Still referring to FIGS. 14 and 15, the second core material layer 200 in the first region 100*a* is patterned using the first spacer 510 as a mask to form a fourth core layer 240 separately located in the first region 100*a*.

It should also be noted that the fourth core layer 240 is made by patterning the second core material layer 200 of the first region 100*a*. As such, the fourth core layer 240 still retains the etching selectivity ratio with the third core layer 230. That is, during the etching process of KOH or SC1 solution, the fourth core layer 240 may be selectively removed, while the third core layer 230 may be hardly damaged.

The fourth core layer 240 is configured to provide support for subsequent formation of the second sidewall. In one embodiment, the fourth core layer 240 is made of a material including unmodified amorphous silicon (a-Si).

In one embodiment, in the process of patterning the second core material layer 200 of the first region 100*a* using the first spacer 510 as a mask to form the fourth core layer 240 separately located on the first region 100*a*, the second core material layer 200 in the first region 100*a* is patterned using the first pattern transfer layer 310 as a mask to form the fourth core layer 240 separately located on the first region 100*a*.

The second core material layer 200 of the first region 100*a* is patterned using the first pattern transfer layer 310 as a mask to form the fourth core layer 240 separated located on the first region 100*a*. As such, the pattern transfer accuracy may be improved, and the pattern size accuracy of the fourth core layer 240 may thus be improved.

It should be noted that the fourth core layer 240 of the first region 100*a* is transferred from the first spacer 510. The pitch of the first spacer 510 is halved based on the pitch of the first mask layer 320. Due to the SADP process, the single DUV lithography etching limit is reduced from approximately 80 nm to approximately 40 nm. Accordingly, preparation is made for subsequently forming the second spacer 810 on the sidewall of the fourth core layer to further reduce the pitch of the second spacer 810 by half compared with the first spacer 510. This is also the characteristic of the SAQP process and the reason why SAQP may form patterns with a pitch of approximately 24 nm.

In one embodiment, in a same process, the second core material layer 200 in the first region 100*a* is patterned using the first spacer 510 and the first pattern transfer layer 310 as a mask, and the second core material layer 200 and the third core material layer 230 in the second region 100*b* are patterned along the second protection layer opening 720 of the second protection layer 710.

In a same process, the second core material layer 200 of the first region 100*a* is patterned using the first spacer 510 as a mask, and the second core material layer 200 and the third core material layer 230 of the second region 100*b* are patterned using the second protection layer 710 as a mask. Accordingly, the process flow may be simplified, and process efficiency may be improved.

Figure 16:
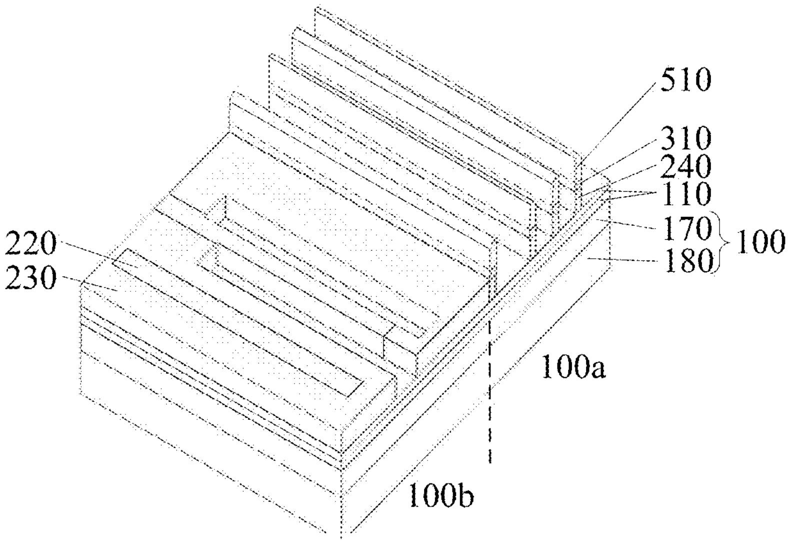

Referring to FIG. 16, after forming the second core layer 220 and the third core layer 230, the process also includes: removing the second protection layer 710. The second protection layer 710 is removed to prepare for the subsequent removal of the second core layer 220. In one embodiment, a dry etching process is used to remove the second protection layer 710.

In one embodiment, either an isotropic or anisotropic etching process may be used, provided that the required etching selectivity ratio of the etching process is met. The etching process has a large etching selectivity for the second protection layer 710 with the first spacer 510. Accordingly, damage to the first spacer 510 during the process of removing the first protection layer 710 may be reduced.

Figure 17:
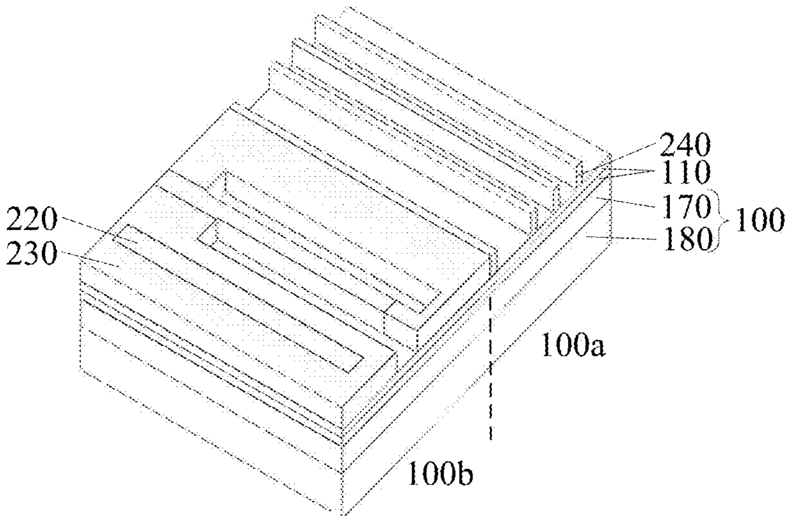

Referring to FIG. 17, after forming the fourth core layer 240, the process also includes: removing the first spacer 510. The first spacer 510 is removed to prepare for the subsequent formation of the second spacer.

In one embodiment, after the fourth core layer 240 is formed, the process also includes: removing the first pattern transfer layer 310. The first pattern transfer layer 310 is removed to prepare for the subsequent formation of the second spacer. In one embodiment, a wet etching process is used to remove the first spacer 510 and the first pattern transfer layer 310.

The wet etching process has the characteristic of isotropic etching. As such, the first spacer 510 and the first pattern transfer layer 310 may be completely removed. Moreover, the cost of the wet etching process may be low, the operations may be simple, and a large etching selectivity ratio may be achieved. Accordingly, during the process of removing the first spacer 510 and the first pattern transfer layer 310, damage to the fourth core layer 240 may be reduced.

Figure 18:
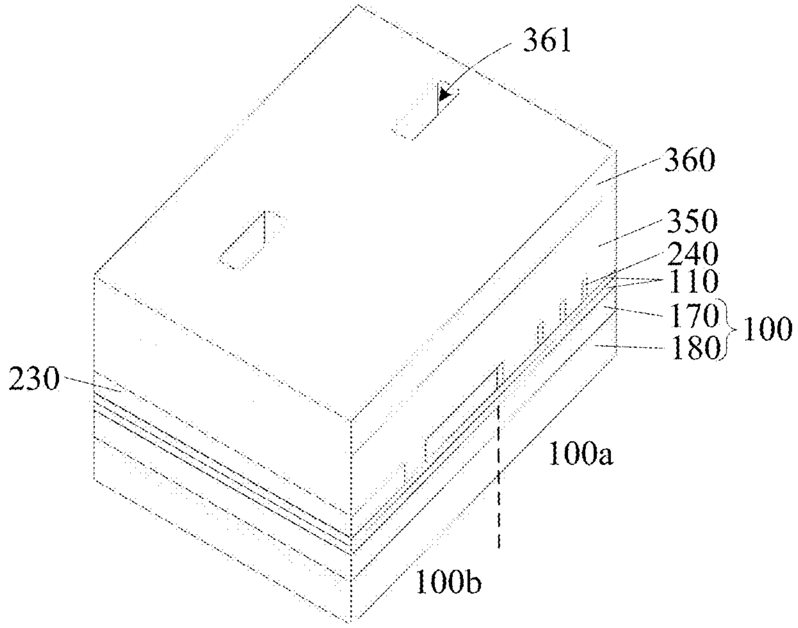
Figure 19:
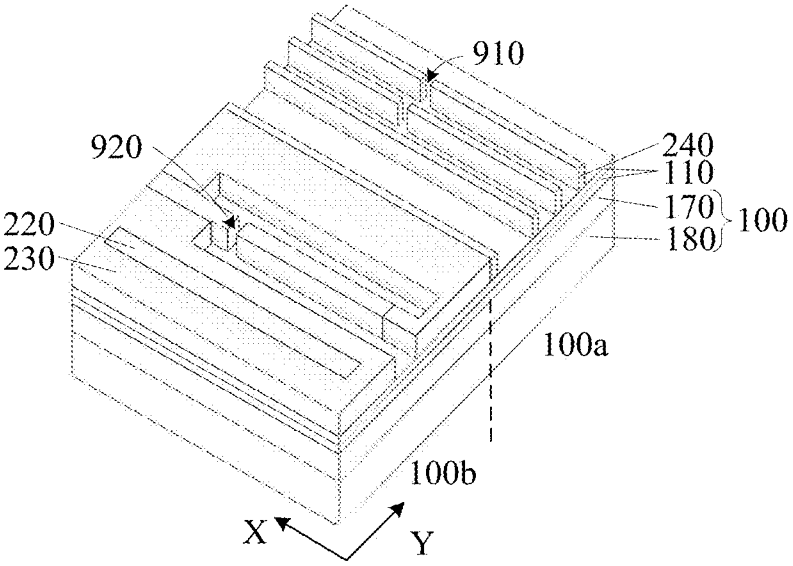

With reference to FIGS. 18 and 19, after forming the second core layer 220, the third core layer 230 and the fourth core layer 240, before subsequently forming the second spacer covering the sidewalls of the second core layer 220, the third core layer 230 and the fourth core layer 240, the process also includes: patterning the fourth core layer 240 of the first region 100*a*, and the second core layer 220 and the third core layer 230 of the second region 100*b*, to form a first partition opening 910 that cuts off a portion of the fourth core layers 240 in the first direction and a second partition opening 920 that cuts off a portion of the second core layers 220 in the first direction.

The first partition opening 910 is configured to subsequently form a first partition structure, and the second partition opening 920 is configured to subsequently form a second partition structure.

Specifically, in one embodiment, referring to FIG. 18, the process of patterning the fourth core layer 240 of the first region 100*a* and the second core layer 220 of the second region 100*b*, to form a first partition opening 910 that cuts off the fourth core layer 240 in the first direction, and a second partition opening 920 that cuts off the second core layer 220 in the first direction includes: forming a third protection layer 350 covering the second core layer 220, the third core layer 230 and the fourth core layer 240, forming a fourth mask layer 360 over the third protection layer 350, and forming fourth mask layer openings 361 in the fourth mask layer 360, crossing the second core layer 220 and the fourth core layer 240 along the second direction. Referring to FIG. 19, the process also includes: patterning the second core layer 220 and the fourth core layer 240 along the fourth mask layer openings 361 through the third protection layer 350 to form the first partition opening 910 that cuts off the fourth core layer 240 in the first direction and a second partition opening 920 that cuts off the second core layer 220 in the first direction.

In one embodiment, the third protection layer 350 is a planarization layer. The third protection layer 350 is made of a material including spin-on carbon (SOC) material. The spin-on carbon may be formed by a spin-coating process, and the process cost may be low. Moreover, by using the spin-on carbon, the flatness of the top surface of the third protection layer 350 may be improved, and a good interface for the formation of the fourth mask layer 360 may be provided.

The fourth mask layer 360 is configured to pattern the second core layer 220 and the fourth core layer 240 through the third protection layer 350. In one embodiment, the fourth mask layer 360 includes an anti-reflective coating (Si-ARC) and a photoresist layer on the anti-reflective coating (Si-ARC).

Still referring to FIG. 19, after forming the first isolating opening 910 that cuts off the fourth core layer 240 in the first direction and the second isolating opening 920 that cuts off the second core layer 220 in the first direction, the process also includes removing the third protection layer 350 and the fourth mask layer 360.

It should be noted that, in a practical process, based on actual process requirements, the process of FIGS. 18 and 19 may be repeated to form a plurality of first partition openings 910 and a plurality of second partition openings 920 at target positions.

Figure 20:
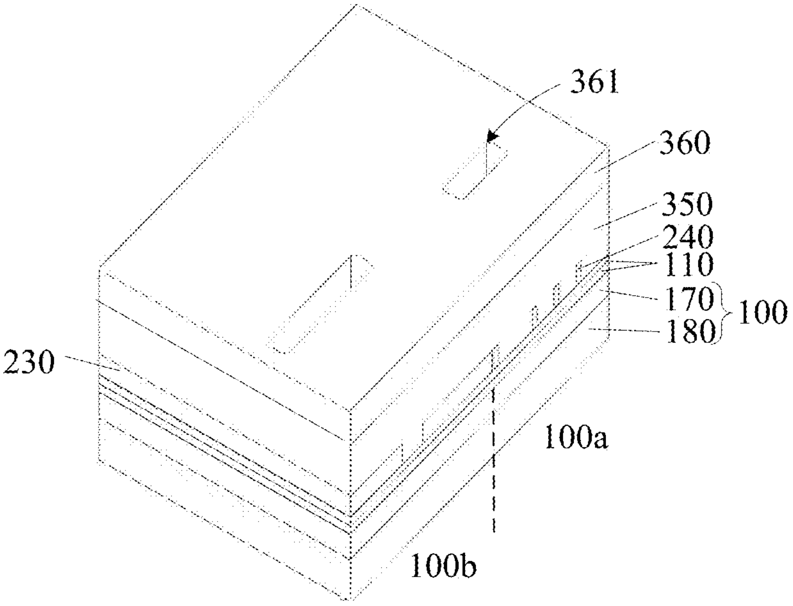
Figure 21:
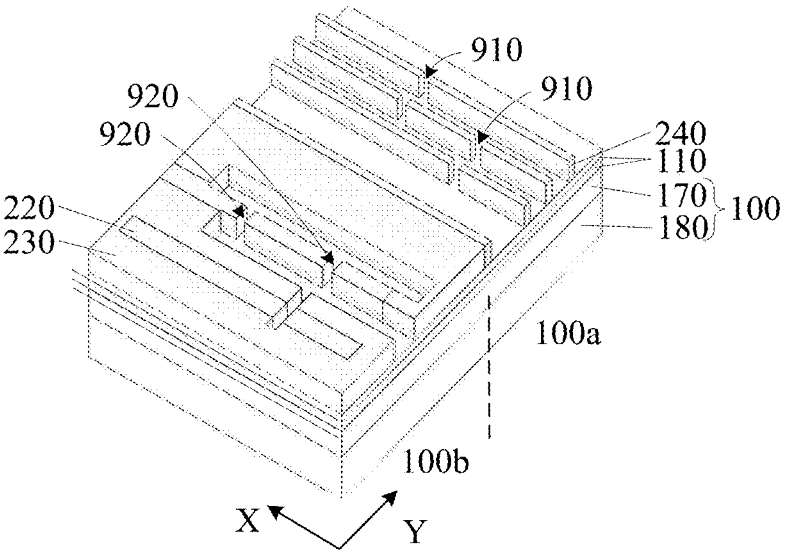

As an example, in one embodiment, the process of forming the first partition opening 910 and the second partition opening 920 are performed twice. As shown in FIGS. 20 and 21, a third protection layer 350 covering the second core layer 220, the third core layer 230 and the fourth core layer 240 is formed. A fourth mask layer 360 is formed over the third protection layer 350. Fourth mask layer openings 361, crossing a portion of the second core layer 220 and the fourth core layer 240 along the second direction, are formed in the fourth mask layer 360. The second core layer 220 and the fourth core layer 240 are patterned through the third protection layer 350 along the fourth mask layer openings 361 to form the first partition opening 910 that cuts off a portion of the fourth core layer 240 in the first direction and the second partition opening 920 that cuts off a portion of the second core layer 220 in the first direction.

Returning to FIG. 35, after forming the fourth core layer in the first region, a second spacer covering the sidewalls of the second core layer, the third core layer, and the fourth core layer may be formed (S109). FIGS. 22-28 illustrate corresponding semiconductor structures.

Referring to FIGS. 22 to 28, a second spacer 810 covering the sidewalls of the second core layer 220, the third core layer 230, and the fourth core layer 240 is formed. The second spacer 810 may be used as a partial etching mask for subsequently patterning the target material layer 170 in the first region 100*a* and the second region 100*b*. In one embodiment, the second spacer 810 is made of a material including titanium oxide, titanium nitride, silicon oxide, silicon nitride, silicon oxynitride, silicon carbide, or a combination thereof.

Titanium oxide, titanium nitride, silicon oxide, silicon nitride, silicon oxynitride, silicon carbide, or a combination thereof, may form a good etching selectivity ratio with the second core layer 220, the third core layer 230 and the fourth core layer 240. Accordingly, the damage to the second spacer 810 may be reduced in the subsequent processes of removing the second core layer 220 and the fourth core layer 240.

In one embodiment, in the process of forming the second spacer 810 covering the sidewalls of the second core layer 220, the third core layer 230 and the fourth core layer 240, the second spacer 810 also covers the sidewalls of the first partition opening 910 and the sidewalls of the second partition opening 920. Twice the thickness of the second spacer 810 is larger than the sizes of the first partition opening 910 and the second partition opening 920 along the first direction. Accordingly, the second spacers 810 at the sidewalls of the first partition opening 910 are in contact with each other, forming a first partition structure 930. The second spacers 810 at the sidewalls of the second partition opening 920 are in contact with each other, forming a second partition structure 940.

The first partition structure 930 and the second partition structure 940 may be used to transfer the pattern to the target material layer 170. As such, the partition between the first target structure and the second target structure may be directly formed in the target material layer 170. Accordingly, after the target material layer 170 is subsequently patterned, while forming the first target structure and the second target structure in the target material layer 170, the first target structure to be partitioned may be directly partitioned, and the second target structure to be partitioned may be directly partitioned.

Figure 22:
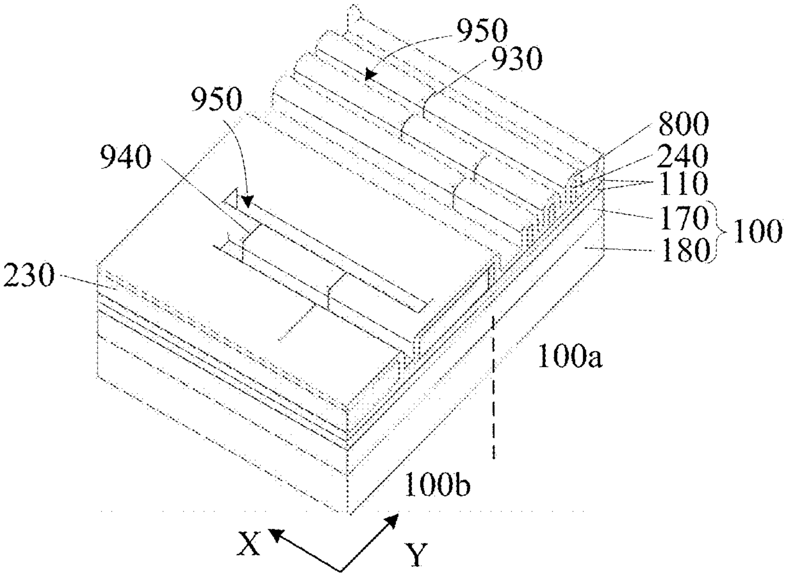

Specifically, referring to FIG. 22, the process of forming the second spacer 810 covering the sidewalls of the second core layer 220, the third core layer 230 and the fourth core layer 240 includes: forming a second spacer material layer 800 covering the sidewalls and tops of the second core layer 220, the third core layer 230 and the fourth core layer 240, and the top of the substrate 100.

The second spacer material layer 800 is configured to directly form the second spacer 810. The second spacer material layer 800 is made of a material including titanium oxide, titanium nitride, silicon oxide, silicon nitride, silicon oxynitride, silicon carbide, or a combination thereof.

In one embodiment, an atomic layer deposition process is used to form the second spacer material layer 800 covering the sidewalls and tops of the second core layer 220, the third core layer 230, and the fourth core layer 240, as well as the top of the substrate 100. The second spacer material layer 800 formed by the atomic layer deposition process may have good thickness uniformity and good step coverage capability. Accordingly, the second spacer material layer 800 may conformally cover the sidewalls and tops of the second core layer 220, the third core layer 230, and the fourth core layer 240, as well as the top of the substrate 100.

In one embodiment, in the process of forming the second spacer material layer 800 covering the sidewalls and tops of the second core layer 220, the third core layer 230 and the fourth core layer 240, and the top of the substrate 100, the second spacer material layer 800 may also fill the first partition opening 910 and the second partition opening 920.

The second spacer material layer 800 covering the sidewalls of the second core layer 220, the third core layer 230 and the fourth core layer 240 may be used as the second spacer 810. The second spacer material layer 800 filling the first partition opening 910 may be used as the first partition structure 930. The second spacer material layer 800 filling the second partition opening 920 may be used as the second partition structure 940.

In one embodiment, when forming the second spacer material layer 800 covering the sidewalls and top of the second core layer 220, the third core layer 230 and the fourth core layer 240, and the top of the substrate 100, the second spacer material layer 800 on the opposite sidewalls forms a trench 950.

It should be noted that the first partition structure 930 may only partition the first target structure corresponding to (directly below) the fourth core layer 240 of the first region 100*a*, but may not partition the trench 950 surrounded by the second spacer 810 of the fourth core layer 240 and the first target structure corresponding to the trench 950. This is also the special feature of the self-aligned block (SAB) technology mentioned in the Background. Similarly, the second partition structure 940 may only partition the second target structure corresponding to the second core layer 220 of the second region 100*b*, but may not partition the second target structures corresponding to the third core layer 230 and the trench 950 surrounded by the second spacer material layer 800 on the sidewall of the second core layer 220.

Referring to FIGS. 23 to 27, after forming the second spacer 810 covering the sidewalls of the second core layer 220, the third core layer 230 and the fourth core layer 240, before subsequently patterning the target material layer 170 using the second spacer 810 and the third core layer 230 as a mask, the process also includes: forming a third partition structure 960 extending along the second direction and contacting the second spacer 810 in the trenches 950 of the first region 100*a* and the second region 100*b*. The third partition structure 960 partitions the trench 950 in the first direction.

The third partition structure 960 is configured to transfer the pattern to the target material layer 170, such that the partitions of the first target structure and the second target structure, corresponding to the trenches 950 in the first region 100*a* and the second region 100*b*, may be directly formed in the target material layer 170. Accordingly, after the target material layer 170 is subsequently patterned, while forming the first target structure and the second target structure in the target material layer 170, the first target structure to be partitioned may be directly partitioned, and the second target structure to be partitioned may be directly partitioned.

It should be noted that the third partition structure 960 may only partition the first target structure corresponding to (directly below) the trench 950 of the first region 100*a*, but may not partition the first target structure corresponding to the fourth core layer 240. This is also the special feature of the self-aligned block (SAB) technology mentioned in the Background. Similarly, the third partition structure 960 may only partition the second target structure corresponding to the trench 950 of the second region 100*b*, but may not partition the second target structure corresponding to the second core layer 220 of the second region 100*b*.

It should also be noted that in the first region 100*a*, the partition transferred from the third partition structure 960 to the target material layer 170 and the partition transferred from the first partition structure 930 to the target material layer 170 are partitions of adjacent first target structures. In the second region 100*b*, the partition transferred to the target material layer 170 from the third partition structure 960 and the partition transferred to the target material layer 170 from the second partition structure 940 are partitions of adjacent second target structures. Accordingly, by forming the first partition structure 930, the second partition structure 940 and the third partition structure 960 in advance, adjacent first target structures or adjacent second target structures may be simultaneously partitioned in the target material layer 170, providing an approach for forming partitions with a close pitch.

Figure 23:
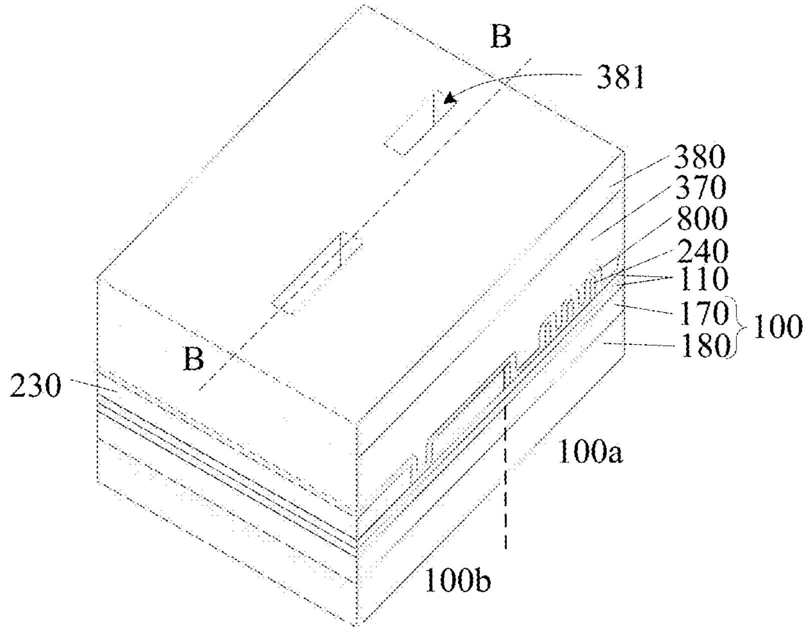
Figure 24:
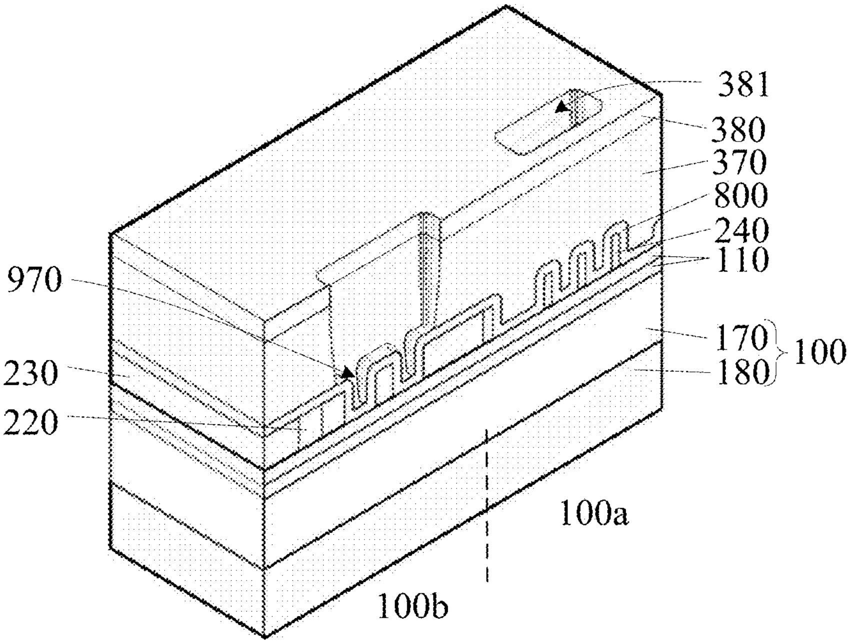

Specifically, referring to FIGS. 23 and 24, where FIG. 24 is a cross-sectional view of FIG. 23 taken along the BB direction, in one embodiment, a process of forming the third partition structure 960 extending along the second direction and contacting the second spacer 810 in the trenches 950 of the first region 100*a* and the second region 100*b* includes: forming a fourth protection layer 370 covering the second spacer material layer 800 and filling the trenches 950, forming a fifth mask layer 380 over the fourth protection layer 370, and in the fifth mask layer 380, forming a fifth mask layer opening 381 crossing the trench 950 along the second direction. The process also includes patterning the fourth protection layer 370 along the fifth mask layer opening 381, and removing the fourth protection layer 370 in the position of the fifth mask layer opening 381 corresponding to the trench 950 to form a third partition opening 970.

In one embodiment, the fourth protection layer 370 is a planarization layer. The fourth protection layer 370 is made of a material including a spin-on carbon (SOC) material. Spin-on carbon may be formed by a spin-coating process, and the process cost may be low. Moreover, by using spin-on carbon, the flatness of the top surface of the fourth protection layer 370 may be improved, and a good interface for the formation of the fifth mask layer 380 may be provided.

The fifth mask layer 380 is configured to pattern the fourth protection layer 370 to form a third partition opening 970. In one embodiment, the fifth mask layer 380 includes an anti-reflective coating (Si-ARC) and a photoresist layer on the anti-reflective coating (Si-ARC).

Figure 25:
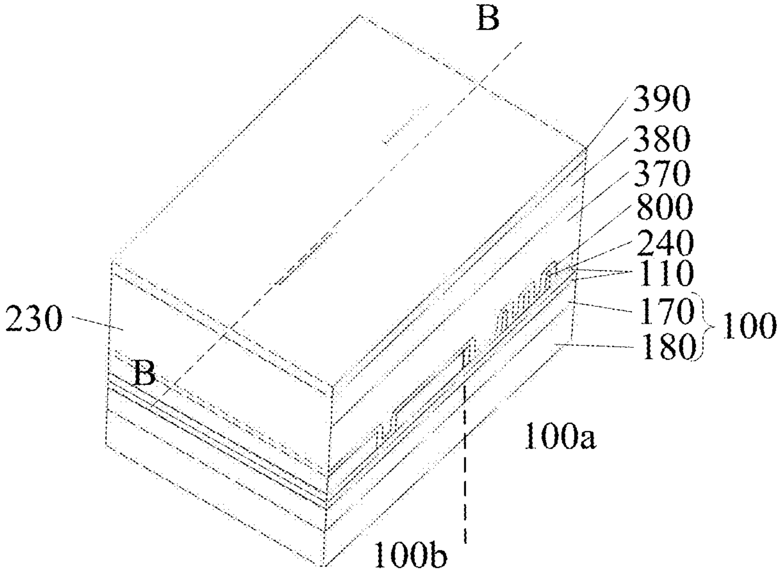
Figure 26:
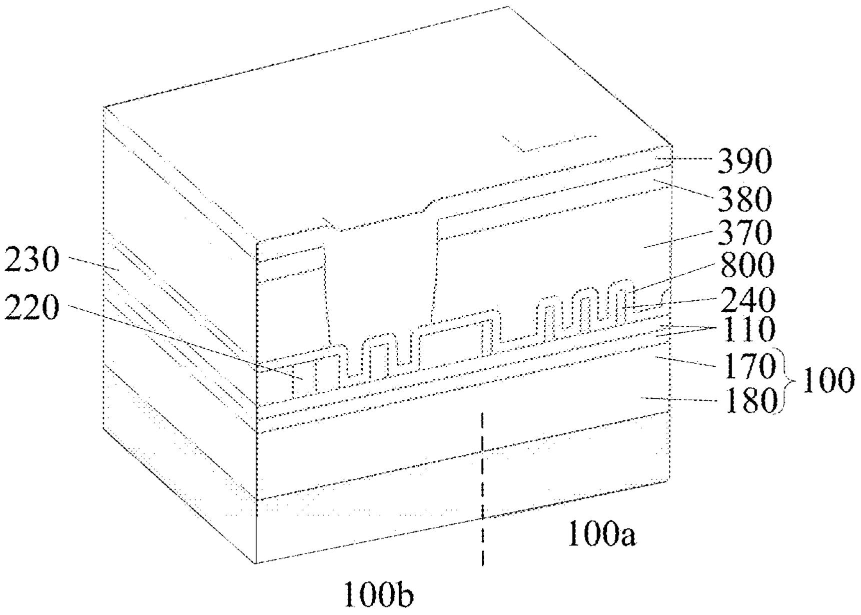

Referring to FIGS. 25 and 26, where FIG. 26 is a cross-sectional view of FIG. 25 along the BB direction, a partition material layer 390 filling the third partition opening 970 may be formed. The partition material layer 390 is configured to form a third partition structure 960.

Figure 27:
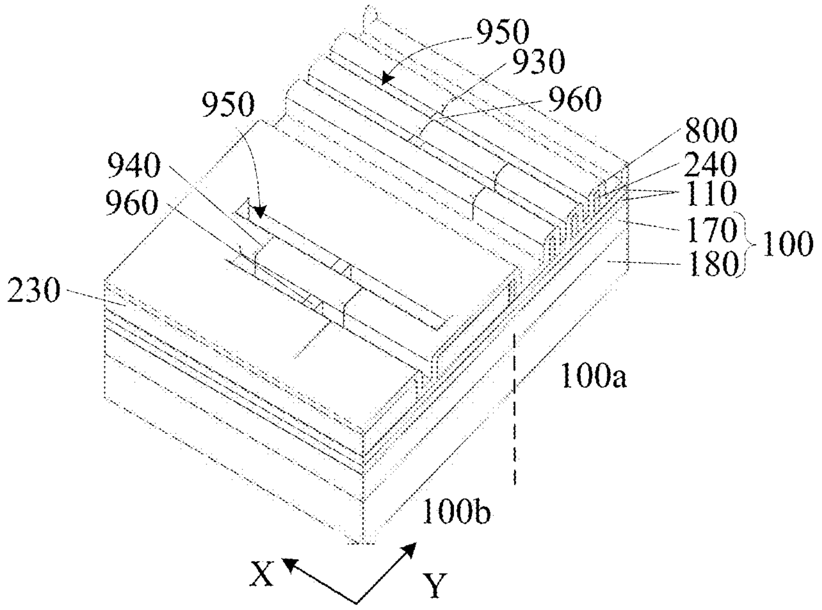

Referring to FIG. 27, after forming the partition material layer 390 filling the third partition opening 970, the process also includes removing the fourth protection layer 370, the fifth mask layer 380, and the partition material layer 390 higher than the second spacer material layer 800.

Figure 28:
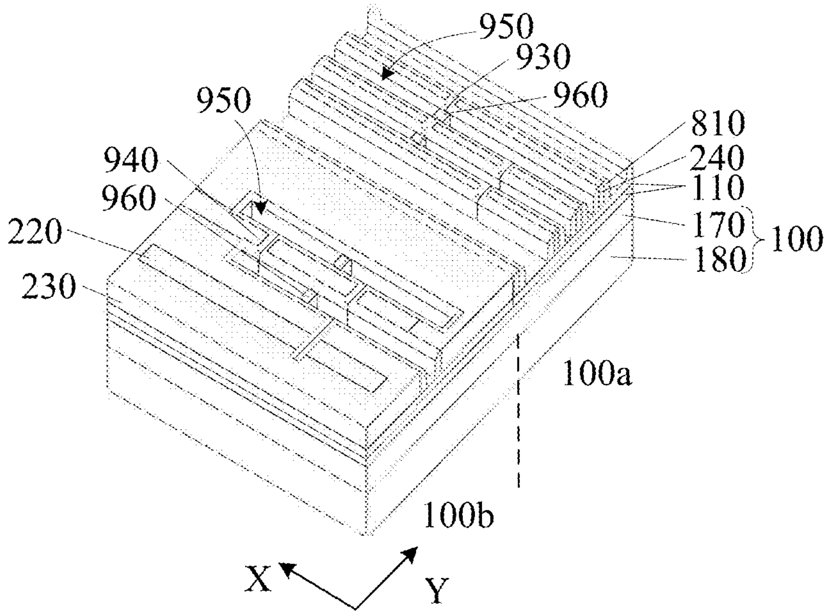

Referring to FIG. 28, the second spacer material layer 800 located on the top of the second core layer 220, the third core layer 230 and the fourth core layer 240, and the top of the substrate 100 is removed. The second spacer material layer 800 located on the sidewalls of the second core layer 220, the third core layer 230 and the fourth core layer 240 is retained as the second spacer 810. The second spacer material layer 800 below the third partition material layer 390 in the trench 950 surrounded by the second spacer material layer 800 is retained. The third partition structure 960 is thus formed.

In one embodiment, a dry etching process is used to remove the second spacer material layer 800 located on the top of the second core layer 220, the third core layer 230 and the fourth core layer 240, and the top of the substrate 100. The dry etching process is an anisotropic dry etching process. By selecting the dry etching process, the damage to the second core layer 220, the third core layer 230 and the fourth core layer 240 may be reduced. In addition, dry etching may have good etching directionality, and the sidewall morphology quality and dimensional accuracy of the second spacer 810 may be improved.

In one embodiment, the second spacer material layer 800 located on the top of the second core layer 220, the third core layer 230 and the fourth core layer 240, and the top of the substrate 100 is removed, exposing the top of the second core layer 220, the third core layer 230, and the fourth core layer 240.

In one embodiment, in the process of removing the second spacer material layer 800 located on the top of the second core layer 220, the third core layer 230 and the fourth core layer 240, and the top of the substrate 100, the partition material layer 390 higher than the top of the second core layer 220, the third core layer 230 and the fourth core layer 240 is also removed. The partition material layer 390 in the third partition opening 970 is retained as the third partition structure 960 for subsequent pattern transfer to the target material layer 170.

Figure 29:
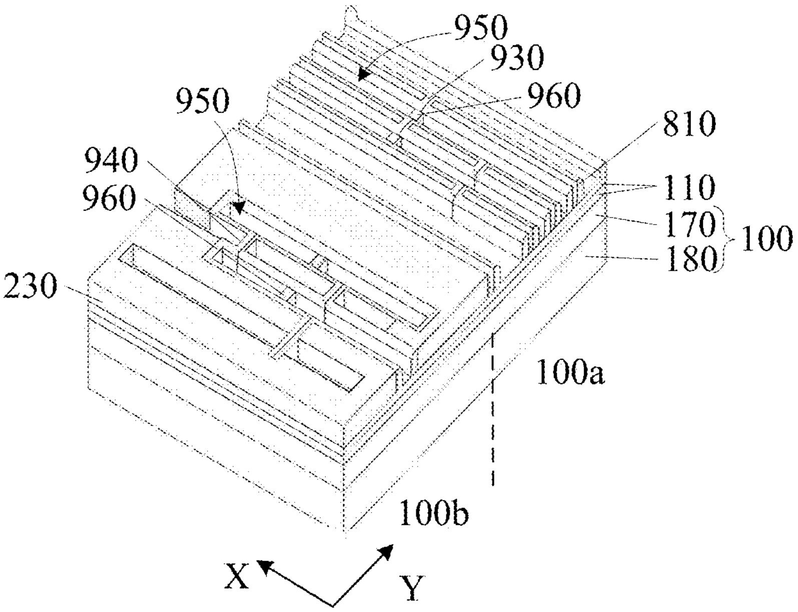

Referring to FIG. 29, the second core layer 220 and the fourth core layer 240 are removed. The second core layer 220 and the fourth core layer 240 are removed to prepare for the subsequent patterning of the target material layer 170 in the first region 100*a* and the second region 100*b* by using the second spacer 810 and the third core layer 230 as a mask.

In one embodiment, a wet etching process is used to remove the second core layer 220 and the fourth core layer 240. The wet etching process may have the characteristic of isotropic etching, and the second core layer 220 and the fourth core layer 240 may be completely removed. Moreover, the cost of the wet etching process may be low, the operation process may be simple, and the etching selectivity ratio may be large. Accordingly, damage to the second spacer 810 during the process of removing the second core layer 220 and the fourth core layer 240 may be reduced.

In one embodiment, the fourth core layer 240 and the second core layer 220 are made of a same material. After the second spacer 810 is formed, the fourth core layer 240 and the second core layer 220 are removed in a same process. Accordingly, the process flow may be simplified, and process efficiency may be improved.

In one embodiment, in the process of removing the second core layer 220 and the fourth core layer 240 by a wet etching process, the etching solution of the wet etching process includes a KOH solution, a THMA solution, an SC1 solution, or a combination thereof.

In one embodiment, the fourth core layer 240 and the second core layer 220 are made of an undoped silicon material. The third core layer 230 is made of a doped silicon material. KOH solution or THMA solution may have a high etching rate for undoped silicon but almost no etching rate for doped (especially B ion doped) silicon. As such, by using KOH solution or THMA solution as the etching solution, the fourth core layer 240 and the second core layer 220 may be completely removed, and the damage to the third core layer 230 may be reduced. Furthermore, alkaline solutions such as KOH solution, SC1 solution, and THMA solution may have almost no etching rate for the second spacer 810 and the third partition structure 960 formed by the partition material layer 390. Accordingly, the process of removing the fourth core layer 240 and the second core layer 220 may hardly affect other components in the entire pattern transfer process.

Figure 30:
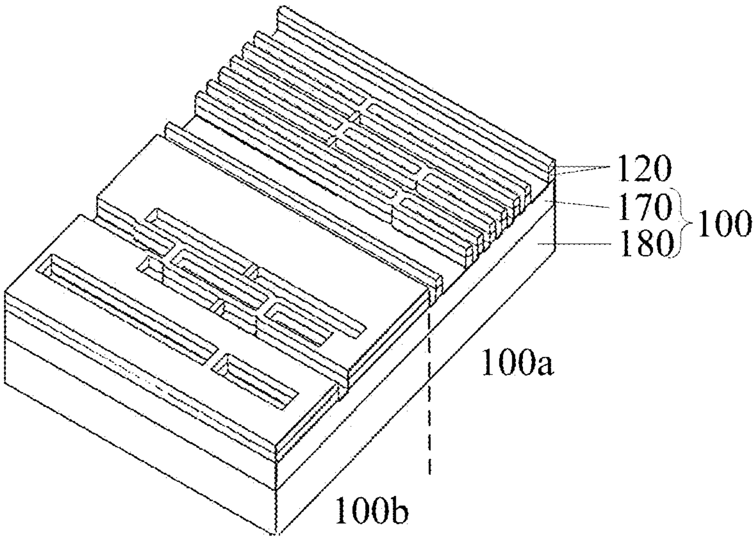
Figure 31:
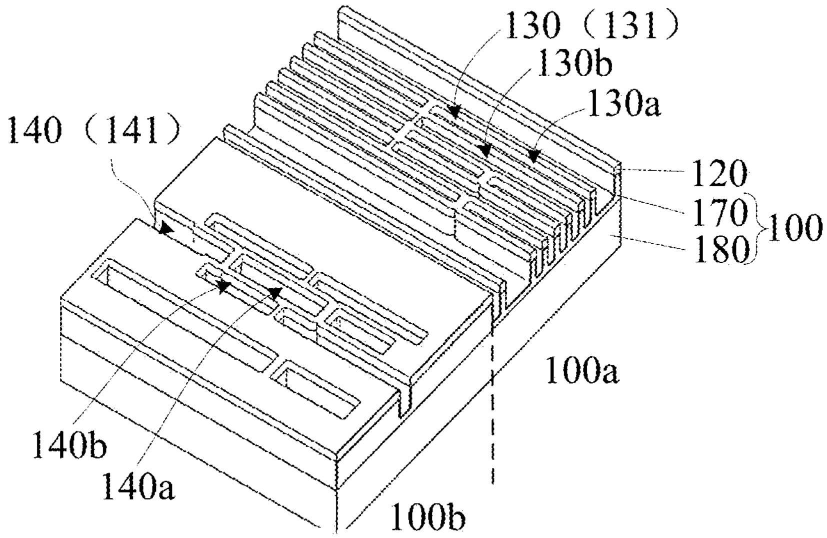

Returning to FIG. 35, after forming the second spacer, a first target structure and a second target structure may be formed (S110). FIGS. 30 and 31 illustrate corresponding semiconductor structures.

Referring to FIGS. 30 and 31, the target material layer 170 may be patterned using the second spacer 810 and the third core layer 230 as a mask to form a first target structure 131 located in the first region 100*a* and a second target structure 141 located in the second region 100*b*.

Specifically, in one embodiment, the target material layer 170 is patterned using the second spacer 810 and the third core layer 230, the first partition structure 930, the second partition structure 940, and the third partition structure 960 as a mask, to form a first target structure 131 located in the first region 100*a* and a second target structure 141 located in the second region 100*b*.

In one embodiment, for the first region 100*a*, SAQP processes are used in forming the first spacer 510 covering the sidewall of the first core layer 410, removing the first core layer 410 after the first spacer 510 is formed, patterning the second core material layer 200 of the first region 100*a* using the first spacer 510 as a mask to form the fourth core layer 240 separately located on the first region 100*a*, forming the second spacer 810 covering the sidewall of the fourth core layer 240, and patterning the target material layer 170 using the second spacer 810 as a mask. The SAQP process may form the first target structure 131 with a relatively small pitch.

For the second region 100*b*, SALELE processes are used in modifying the second core material layer 200 of the second region 100*b* to transform a plurality of second core material layer 200 with partial widths into the third core material layer 210 having an etching selectivity ratio with the second core material layer 200, patterning the second core material layer 200 and the third core material layer 210 of the second region 100*b* using the second protection layer 710, forming the second core layer 220 corresponding to the second core material layer 200 and the third core layer 230 corresponding to the third core material layer 210, forming the second spacer 810 covering the sidewalls of the second core layer 220 and the third core layer 230, and patterning the target material layer 170 using the second spacer 810 and the third core layer 230 as a mask to form the second target structure 141 with a relatively large pitch.

As such, the present disclosure may integrate the SAQP process and the SALELE process. As a result, on the same substrate 100, the first target structure 131 with a relatively small pitch and the second target structure 141 with a relatively large pitch may each be formed. Accordingly, by process integration, more semiconductor process requirements may be met, and the design freedom in the patterning process may be improved.

Specifically, in one embodiment, in the process of patterning the target material layer 170 using the second spacer 810 and the third core layer 230 as a mask to form the first target structure 131 located in the first region 100*a* and the second target structure 141 located in the second region 100*b*, the target material layer 170 may also be patterned using the first partition structure 930 and the second partition structure 940 as a mask. The obtained target material layer 170 corresponding to the first partition structure 930 partitions the first target structure 131 in the first direction. The obtained target material layer 170 corresponding to the second partition structure 940 partitions the second target structure 141 in the first direction.

In one embodiment, in the process of patterning the target material layer 170 using the second spacer 810 and the third core layer 230 as a mask to form the first target structure 131 located in the first region 100*a* and the second target structure 141 located in the second region 100*b*, the target material layer 170 is also patterned using the third partition structure 960 as a mask. The obtained target material layer 170 corresponding to the third partition structure 960 partitions the first target structure 131 and the second target structure 141 in the first direction.

In one embodiment, in the process of patterning the target material layer 170 using the second spacer 810 and the third core layer 230 as a mask, and the dielectric layer is patterned using the second spacer 810 and the third core layer 230 as a mask, to form a first trench 130 and a second trench 140 in the dielectric layer. The first trench 130 may provide space for subsequently forming a first metal wire, and the second trench 140 may provide space location for subsequently forming a second metal wire.

The first trench 130 may be classified into an A-type first trench 130*a* and a B-type first trench 130*b* that are spaced apart from each other. The A-type first trench 130*a* is the first trench 130 corresponding to the fourth core layer 240, and the B-type first trench 130*b* is the first trench 130 corresponding to the trench 950 surrounded by the second spacer material layer 800 of the fourth core layer 240.

The second trench 140 may also be classified into an A-type second trench 140*a* and a B-type second trench 140*b*. The A-type second trench 140*a* is the second trench 140 corresponding to the second core layer 220. The B-type second trench 140*b* is the second trench 140 corresponding to the trench 950 surrounded by the second spacer material layer 800 on the sidewalls of the third core layer 230 and the second core layer 220.

In one embodiment, the dielectric layer corresponding to the first partition structure 930 may partition the A-type first trench 130*a* in the first direction. The dielectric layer corresponding to the second partition structure 940 may partition the A-type second trench 140*a* in the first direction. The dielectric layer corresponding to the third partition structure 960 may partition the B-type first trench 130*b* and the B-type second trench 140*b* in the first direction.

Specifically, referring to FIG. 30, the process of patterning the target material layer 170 using the second spacer 810 and the third core layer 230 as a mask includes: patterning the mask material layer 110 using the second spacer 810 and the third core layer 230 as a mask to form a second pattern transfer layer 120. The second pattern transfer layer 120 may be used as an etching mask for patterning the target material layer 170.

In one embodiment, after forming the second pattern transfer layer 120, before subsequently patterning the target material layer 170 using the second pattern transfer layer 120 as a mask, the process also includes: removing the second spacer 810 and the third core layer 230 to prepare for subsequent patterning of the target material layer 170 using the second pattern transfer layer 120 as a mask.

Referring to FIG. 31, the target material layer 170 is patterned using the second pattern transfer layer 120 as a mask. The patterns of the second spacer 810 and the third core layer 230 are transferred to the target material layer 170 through the second pattern transfer layer 120. Accordingly, the pattern transfer accuracy may be improved, and the size accuracy of the first target structure 131 and the second target structure 141 may be improved.

It should be noted that the target material layer 170 is patterned by using the second pattern transfer layer 120 as a mask through an etching process. As such, the second pattern transfer layer 120 may be thinned in the process of patterning the target material layer 170. For example, the silicon oxide layer in the second pattern transfer layer 120 may be removed.

Figure 32:
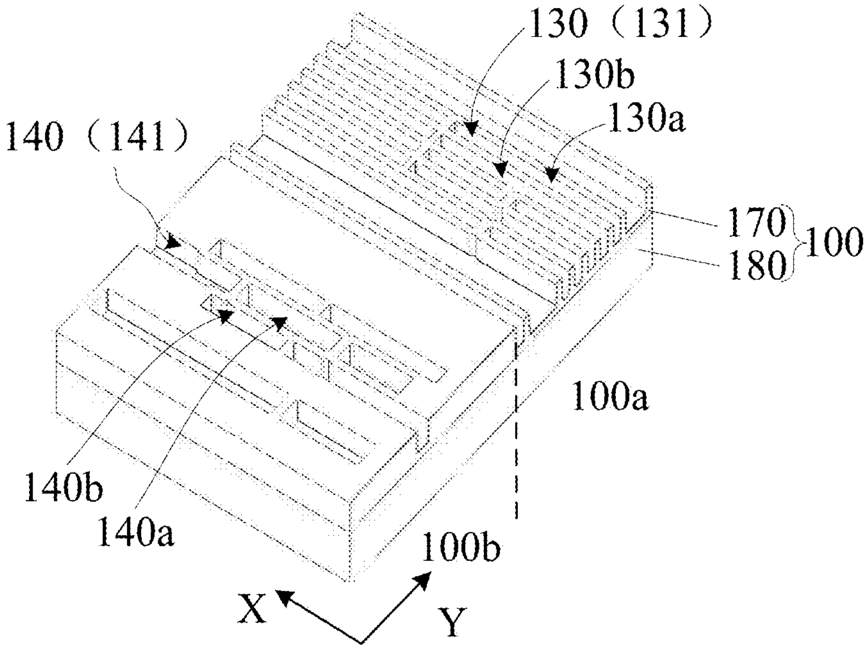

Referring to FIG. 32, after forming the first target structure 131 and the second target structure 141, the process also includes: removing the second pattern transfer layer 120. The second pattern transfer layer 120 is removed to prepare for the subsequent formation of the first metal wire and the second metal wire.

Figure 33:
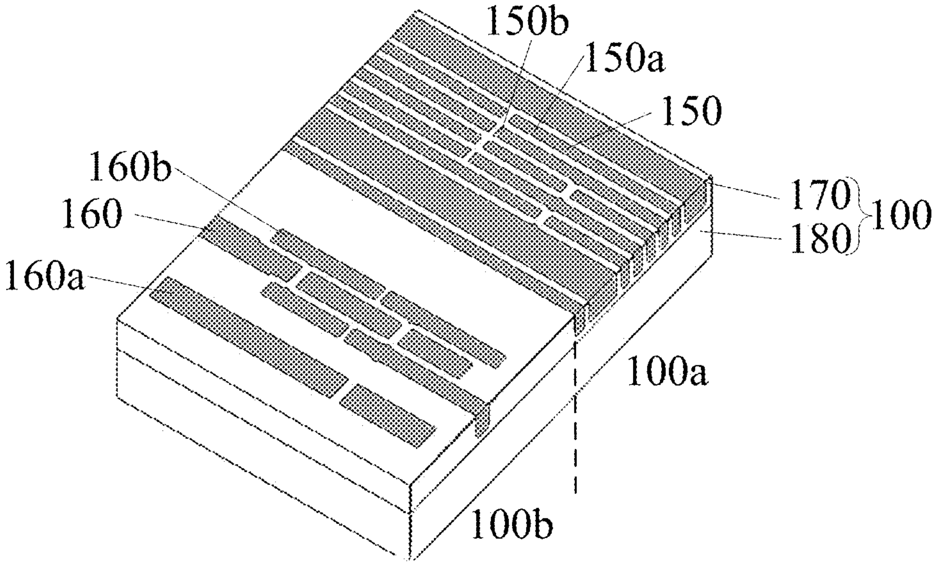
Figure 33:
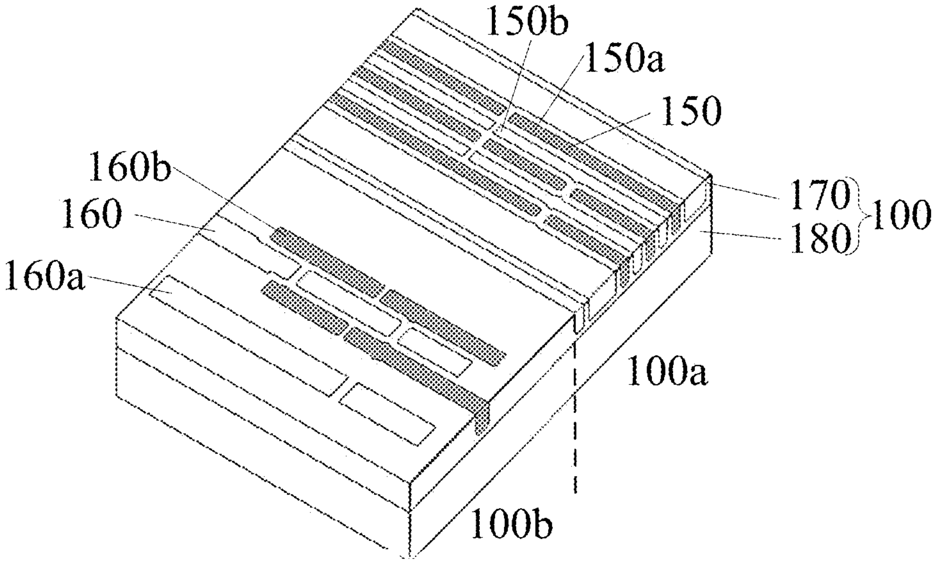

Referring to FIG. 33, after forming the first target structure 131 located in the first region 100*a* and the second target structure 141 located in the second region 100*b*, the process also includes: forming a first metal wire 150 in the first trench 130, and forming a second metal wire 160 in the second trench 140. The first metal wire 150 and the second metal wire 160 are metal interconnects in the back-end process. FIG. 33(*a*) and FIG. 33(*b*) schematically distinguish different types of first metal wires 150 and second metal wires 160.

Specifically, the first metal wire 150 may be classified into A-type first metal wires 150*a* (black-filled first metal wires 150 in the first region 100*a* as shown in FIG. 33 (*b*)) and B-type first metal wires 150*b* (white-filled first metal wires 150 in the first region 100*a* as shown in FIG. 33 (*b*)) arranged at intervals from each other. The A-type first metal wire 150*a* is a metal wire corresponding to the fourth core layer 240, and the B-type first metal wire 150*b* is a metal wire corresponding to the trench 950 surrounded by the second spacer material layer 800 of the fourth core layer 240.

Similarly, the second metal wire may also be classified into A-type second metal wires 160*a* (white-filled second metal wires 160 in the second region 100*b* as shown in FIG. 33(*b*)) and B-type second metal wires 160*b* (black-filled second metal wires 160 in the second region 100*b* as shown in FIG. 33(*b*)). The A-type second metal wire 160 *a* is a metal wire corresponding to the second core layer 220, and the B-type second metal wire 160*b* is a metal wire corresponding to the trench 950 surrounded by the second spacer material layer 800 on the sidewalls of the third core layer 230 and the second core layer 220. The A-type second metal wire 160*a* and the B-type second metal wire 160*b* may be spaced apart from each other. The pitch between the second metal wires and the width and length of the second metal wires may be adjusted. Accordingly, the design of the second metal wires may be more flexible compared to the design of the first metal wires 150.

In one embodiment, the dielectric layer corresponding to the first partition structure 930 partitions the A-type first metal wire 150*a* in the first direction. The dielectric layer corresponding to the second partition structure 940 partitions the A-type second metal wire 160*a* in the first direction. The dielectric layer corresponding to the third isolation structure 960 partitions the B-type first metal wire 150*b* and the B-type second metal wire 160*b* in the first direction.

The dielectric layer is an inter metal dielectric (IMD) layer. The dielectric layer may be used to achieve electrical isolation between metal interconnects in the fabrication process of the back end of line (BEOL).

FIG. 34 illustrates an exemplary forming method. As shown in FIG. 34, a 6T standard cell area, a 7.5T standard cell area, and a memory/input-output (SRAM/IO) area may be formed on the substrate simultaneously. In FIG. 34, a black area indicates a corresponding device area.

Specifically, as shown in FIG. 34 (*a*), in the 6T standard cell area, the metal pitch reaches about 30 nm, uniform metal wires are required for routing, and wider power rails are needed. The SAQP process may be used to form the 6T standard cell area. As shown in FIG. 34 (*b*), in the 7.5T standard cell area, the metal pitch is about 40 nm, uniform metal wires are required for routing, and wider power rails are needed. The SALELE process may be used to form the 7.5T standard cell area. As shown in FIG. 34 (*c*), in the memory/input-output area, the metal pitch is greater than about 50 nm, and metal routing without clear layout rules is needed. The SALELE process may be used to form the memory/input and output area. Accordingly, in the present disclosure, by combining the SAQP process and the SALELE process, the 6T standard cell area, the 7.5T standard cell area, and the memory/input-output area with different pitch requirements may be formed on a same substrate simultaneously.

The embodiments disclosed in the present disclosure are exemplary only and not limiting the scope of the present disclosure. Various combinations, alternations, modifications, or equivalents to the technical solutions of the disclosed embodiments may be obvious to those skilled in the art and may be included in the present disclosure. Without departing from the spirit of the present disclosure, the technical solutions of the present disclosure may be implemented by other embodiments, and such other embodiments are intended to be encompassed within the scope of the present disclosure.

What is claimed is:

1. A method of forming a semiconductor structure, comprising:

providing a substrate, wherein the substrate includes a base and a target material layer located over the base, a second core material layer and a first core material layer located over the second core material layer are formed over the substrate, and the substrate includes a first region and a second region;

patterning the first core material layer to form a first core layer separately located in the first region;

forming a first spacer covering a sidewall of the first core layer;

forming a first protection layer, wherein the first protection layer is separately located over the second core material layer in the second region, and covers the first spacer and the second core material layer in the first region;

modifying a portion of the second core material layer in the second region using the first protection layer as a mask to form a third core material layer having an etching selectivity ratio with an unmodified portion of the second core material layer, wherein the unmodified portion of the second core material layer is separately located in the second region and is surrounded by the third core material layer of the second region;

forming a second protection layer over the second core material layer and the third core material layer in the second region, wherein a plurality of second protection layer openings extending along a first direction and arranged in parallel with a second direction is formed in the second protection layer, and the first direction is perpendicular to the second direction;

patterning the second core material layer and the third core material layer of the second region along the plurality of second protection layer openings of the second protection layer to form a second core layer corresponding to the second core material layer and a third core layer corresponding to the third core material layer;

patterning the second core material layer in the first region using the first spacer as a mask to form a fourth core layer separately located in the first region;

forming a second spacer covering sidewalls of the second core layer, the third core layer, and the fourth core layer; and patterning the target material layer by using the second spacer and the third core layer as a mask, to form a first target structure located in the first region and a second target structure located in the second region, wherein the first target structure and the second target structure each extend along the first direction, and a pitch of adjacent first target structures of the first target structure is less than or equal to a pitch of adjacent second target structures of the second target structure.

2. The method according to claim 1, wherein:

in a process of providing the substrate, the target material layer is a dielectric layer; the first target structure is a first trench, and the second target structure is a second trench;

in a process of patterning the target material layer by using the second spacer and the third core layer as a mask, the dielectric layer is patterned by using the second spacer and the third core layer as a mask, and the first trench and the second trench are formed in the dielectric layer; and after forming the first target structure located in the first region and the second target structure located in the second region, the method further comprises: forming a first metal wire in the first trench, and forming a second metal wire in the second trench.

3. The method according to claim 1, wherein:

in a process of providing the substrate, the first region includes a logic device area, and the second region includes a peripheral device area; and a thickness of a gate oxide layer in the logic device area is smaller than a thickness of a gate oxide layer in the peripheral device area.

4. The method according to claim 1, wherein:

the pitch of the adjacent first target structures is approximately 24 nm to 38 nm, and the pitch of the adjacent second target structures is approximately 38 nm to 200 nm.

5. The method according to claim 1, wherein a process of patterning the first core material layer to form the first core layer separately located in the first region includes:

forming a first mask layer separately located over the first core material layer in the first region;

patterning the first core material layer by using the first mask layer as a mask to form the first core layer separately located in the first region; and after forming the first core layer, removing the first mask layer.

6. The method according to claim 1, wherein a process of forming the first spacer covering the sidewall of the first core layer includes:

forming a first spacer material layer covering the sidewall and a top of the first core layer, and located over the second core material layer;

removing the first spacer material layer on the top of the first core layer and the first spacer material layer located over the second core material layer, and the first spacer material layer remained on the sidewall of the first core layer forming the first spacer; and after forming the first spacer, removing the first core layer.

7. The method according to claim 1, wherein a process of forming the first protection layer separately located on the second core material layer in the second region and covering the first spacer and the second core material layer in the first region includes:

forming a first protective material layer covering the first spacer and the second core material layer;

patterning the first protection material layer located in the second region to form the first protection layer, wherein the first protection layer includes the first protection layer separately located on the second region, and the first protection material layer retained covering the second core material layer in the first region; and after forming the third core material layer, removing the first protection layer.

8. The method according to claim 1, wherein:

in a process of modifying a portion of the second core material layer in the second region using the first protection layer as a mask, a portion of the second core material layer in the second region is ion-implanted using the first protection layer as a mask, to form the third core material layer having an etching selectivity ratio with the second core material layer that is not ion-implanted.

9. The method according to claim 8, wherein:

in a process of providing the substrate, the second core material layer is made of a material including amorphous silicon, polycrystalline silicon, single crystal silicon, silicon oxide, advanced patterning film material, spin-on carbon, silicon carbide, or a combination thereof; and in a process of performing ion implantation on the second core material layer using the first protection layer as a mask, ions implanted by the ion implantation include boron, phosphorus, arsenic, boron chloride, boron dichloride, carbon, or a combination thereof.

10. The method according to claim 1, wherein:

a process of forming the second protection layer over the second core material layer and the third core material layer in the second region includes: forming a second protection material layer covering the second core material layer, the third core material layer, and the first spacer;

patterning the second protection material layer, removing the second protection material layer in the first region, removing a plurality of the second protective material layers with a partial length extending along the first direction and a partial width along the second direction in the second region, and retaining a remained portion of the second protection layer located in the second region as the second protection layer; and after forming the second core layer and the third core layer, removing the second protection layer.

11. The method according to claim 1, wherein:

in a same process, the second core material layer in the first region is patterned using the first spacer as a mask, and the second core material layer and the third core material layer in the second region are patterned along the second protection layer openings of the second protection layer.

12. The method according to claim 1, after forming the fourth core layer, further comprising removing the first spacer.

13. The method according to claim 1, wherein:

in a process of modifying a portion of the second core material layer in the second region using the first protection layer as a mask, the unmodified portion of the second core material layer has a size of approximately 35 nm to 200 nm along the second direction and a pitch of approximately 76 nm to 200 nm, and the third core material layer has a size of approximately 35 nm to 200 nm along the second direction and a pitch of approximately 76 nm to 200 nm.

14. The method according to claim 1, wherein a process of forming the second spacer covering the sidewalls of the second core layer, the third core layer, and the fourth core layer includes:

forming a second spacer material layer covering the sidewalls and tops of the second core layer, the third core layer and the fourth core layer, and a top of the substrate;

removing the second spacer material layer located on the tops of the second core layer, the third core layer and the fourth core layer, and the top of the substrate; and retaining the second spacer material layer located on the sidewalls of the second core layer, the third core layer and the fourth core layer as the second spacer.

15. The method according to claim 14, wherein:

in a process of forming the second spacer material layer covering the sidewalls and the tops of the second core layer, the third core layer and the fourth core layer, and the top of the substrate, the second spacer material layer on opposite sidewalls of the sidewalls forms a trench;

after forming the second spacer material layer covering the sidewalls and the tops of the second core layer, the third core layer and the fourth core layer, and the top of the substrate, and before removing the second spacer material layer located on the tops of the second core layer, the third core layer and the fourth core layer, and the top of the substrate, the method further comprises: in the trench of the first region and the second region, forming a third partition structure extending along the second direction and contacting the second spacer, wherein the third partition structure partitions the trench in the first direction; and in a process of patterning the target material layer using the second spacer and the third core layer as a mask to form the first target structure located in the first region and the second target structure located in the second region, the target material layer is patterned using the third partition structure as a mask, and the target material layer obtained, corresponding to the third partition structure, partitions the first target structure and the second target structure in the first direction.

16. The method according to claim 1, wherein:

in a process of providing the substrate, an etching stop layer is also formed between the first core material layer and the second core material layer;

before modifying a portion of the second core material layer in the second region using the first protection layer as a mask, the method further comprises: patterning the etch stop layer using the first spacer as a mask to form a first pattern transfer layer;

in a process of patterning the second core material layer of the first region using the first spacer as a mask to form the fourth core layer separately located on the first region, the second core material layer in the first region is patterned using the first pattern transfer layer as a mask, to form the fourth core layer separately located on the first region; and after forming the fourth core layer, the method further comprises: removing the first pattern transfer layer.

17. The method according to claim 1, before patterning the target material layer using the second spacer and the third core layer as a mask, further comprising:

removing the second core layer and the fourth core layer, wherein:

the second core layer and the fourth core layer are removed with a wet etching process; and an etching solution of the wet etching process includes a KOH solution, a THMA solution, an SC1 solution, or a combination thereof.

18. The method according to claim 1, wherein:

in a process of providing the substrate, a mask material layer is also formed between the target material layer and the second core material layer;

a process of patterning the target material layer using the second spacer and the third core layer as a mask includes: patterning the mask material layer using the second spacer and the third core layer as a mask to form a second pattern transfer layer;

the target material layer is patterned using the second pattern transfer layer as a mask;

after forming the first target structure and the second target structure, the method further comprises: removing the second pattern transfer layer; and after forming the second pattern transfer layer, before patterning the target material layer using the second pattern transfer layer as the mask, the method further comprises: removing the second spacer and the third core layer.

19. The method according to claim 1, wherein:

in a process of providing the substrate, the first core material layer is made of a material including amorphous silicon, polycrystalline silicon, single crystal silicon, silicon oxide, advanced patterning film material, spin-on carbon, silicon carbide, or a combination thereof;

in a process of forming the first spacer covering the sidewall of the first core layer, the first spacer is made of a material including titanium oxide, titanium nitride, silicon oxide, silicon nitride, silicon oxynitride, silicon carbide, or a combination thereof; and in a process of forming the second spacer covering the sidewalls of the second core layer, the third core layer and the fourth core layer, the second spacer is made of a material including titanium oxide, titanium nitride, silicon oxide, silicon nitride, silicon oxynitride, silicon carbide, or a combination thereof.

20. The method according to claim 1, wherein:

after forming the second core layer, the third core layer and the fourth core layer, before forming the second spacer covering the sidewalls of the second core layer, the third core layer and the fourth core layer, the method further comprises: patterning the fourth core layer of the first region, and the second core layer and the third core layer of the second region, to form a first partition opening that cuts off the fourth core layer in the first direction, and a second partition opening that cuts off the second core layer in the first direction;

in a process of forming the second spacer covering the sidewalls of the second core layer, the third core layer and the fourth core layer, the second spacers also cover sidewalls of the first partition opening and sidewalls of the second partition opening, the second spacers at the sidewalls of the first partition opening are in contact with each other, forming a first partition structure, and the second spacers at the sidewalls of the second partition opening are in contact with each other, forming a second partition structure; and in a process of patterning the target material layer using the second spacer and the third core layer as a mask to form the first target structure located in the first region and the second target structure located in the second region, the target material layer is patterned using the first partition structure and the second partition structure as a mask, wherein the target material layer obtained, corresponding to the first partition structure, partitions the first target structure in the first direction, and the target material layer obtained, corresponding to the second partition structure, partitions the second target structure in the first direction.

* * * * *